United States Patent
Kim et al.

(10) Patent No.: US 9,076,993 B2
(45) Date of Patent: Jul. 7, 2015

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: MinKi Kim, Paju-si (KR); HanSun Park, Paju-si (KR); Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/140,844

(22) Filed: Dec. 26, 2013

(65) Prior Publication Data
US 2014/0183501 A1 Jul. 3, 2014

(30) Foreign Application Priority Data

Dec. 27, 2012 (KR) .................. 10-2012-0155597
Dec. 19, 2013 (KR) .................. 10-2013-0158972

(51) Int. Cl.
*H01L 29/08* (2006.01)
*H01L 51/56* (2006.01)
*H01L 51/52* (2006.01)
*H01L 27/32* (2006.01)

(52) U.S. Cl.
CPC ............ *H01L 51/56* (2013.01); *H01L 51/5228* (2013.01); *H01L 27/3246* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 2002/0158835 A1* | 10/2002 | Kobayashi et al. | ........... 345/100 |
| 2004/0100191 A1* | 5/2004 | Park | .............. 313/506 |
| 2006/0017375 A1 | 1/2006 | Noguchi et al. | |
| 2007/0290956 A1 | 12/2007 | Young et al. | |
| 2008/0197778 A1* | 8/2008 | Kubota | .............. 315/73 |
| 2010/0097295 A1 | 4/2010 | Kwak | |

FOREIGN PATENT DOCUMENTS

| | | |
|---|---|---|
| KR | 10-0929167 B1 | 12/2009 |
| KR | 10-2010-0016880 A | 2/2010 |
| KR | 10-2010-0042799 A | 4/2010 |

OTHER PUBLICATIONS

PCT International Search Report for PCT/KR2013/012246, Apr. 15, 2014, 4 Pages.

* cited by examiner

*Primary Examiner* — Kyoung Lee
(74) *Attorney, Agent, or Firm* — Fenwick & West LLP

(57) ABSTRACT

Provided are an organic light emitting display device and a method for manufacturing the same. The organic light emitting display device comprises at least a first pixel area and a second pixel area. A partition is disposed between the first pixel area and the second pixel area. An auxiliary electrode is disposed between the first pixel area and the second pixel area and over the partition. Additionally, a first conductive element is disposed over the first pixel area, the second pixel area, and the auxiliary electrode and the first conductive element is electrically connected to the auxiliary electrode.

26 Claims, 18 Drawing Sheets

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2012-0155597 filed on Dec. 27, 2012, in the Korean Intellectual Property Office and the priority of Korean Patent Application No. 10-2013-0158972 filed on Dec. 19, 2013, in the Korean Intellectual Property Office, the disclosure of which is incorporated herein by reference.

BACKGROUND

1. Field of Technology

The embodiments herein relate to an organic light emitting display device and a method for manufacturing the same, and more particularly, to an organic light emitting display with an auxiliary electrode for reducing voltage drops.

2. Description of the Related Art

An organic light emitting display device, as a self-emission display device, does not require a separate light source as a liquid crystal display. The organic light emitting display device is more power efficient and has better response speed, viewing angle, and contrast ratio than the liquid crystal display, making it a promising next-generation display device.

In an organic light emitting display device employing a top emission type organic light emitting element, the light emitted from the organic emission layer exits upward through a transparent or semi-transparent electrode cathode. To obtain sufficient light transmittance rate through the cathode, the cathode needs to be formed very thin. Therefore, the cathode is made of a transparent conductive material such as indium tin oxide (ITO), or magnesium-silver (MgAg) having a sufficiently low thickness so that the cathode is transparent. The decrease in thickness of the cathode, however, increases the surface electrical resistance. The increased electrical resistance, in turn, causes voltage drop (i.e., IR drop) in some parts of the organic light emitting display device, creating non-uniform luminance throughout the screen. The voltage drop phenomenon intensifies as the size of the display device increases. In this specification, the term "voltage drop" or "IR drop" refers to the phenomenon in which a potential difference between the anode and the cathode of the organic light emitting element decreases.

Accordingly, there remains a need for an organic light emitting display device with improved configuration for reducing the voltage drop problem.

SUMMARY

Accordingly, an aspect of the embodiments herein relates to an organic light emitting display device with improved configuration of an auxiliary electrode for reducing the voltage drop in the display device.

In one embodiment, the organic light emitting display device comprises at least a first pixel area and a second pixel area. A partition is disposed between the first pixel area and the second pixel area. An auxiliary electrode is disposed between the first pixel area and the second pixel area and over the partition. Additionally, a first conductive element is disposed over the first pixel area, the second pixel area, and the auxiliary electrode and the first conductive element is electrically connected to the auxiliary electrode.

In one embodiment, the organic light emitting display device comprises at least a first pixel area and a second pixel area. An auxiliary electrode is disposed between the first pixel area and the second pixel area. A supplemental conductive layer is disposed on the auxiliary electrode. Furthermore, a partition is disposed between the first pixel area and the second pixel area over a part of the auxiliary electrode. Also, a first conductive element is disposed over the first pixel area, the second pixel area, and the supplemental conductive layer. The first conductive element is electrically connected to the auxiliary electrode via the supplemental conductive layer.

In one embodiment, the organic light emitting display device comprises at least a first pixel area and a second pixel area. An auxiliary electrode is disposed between the first pixel area and the second pixel area. A conductive partition is disposed on at least a part of the auxiliary electrode. Furthermore, a first conductive element is disposed over the first pixel area, the second pixel area, and the conductive partition. The first conductive element is in direct contact with the conductive partition and is electrically connected to the auxiliary electrode via the conductive partition.

A method of manufacturing an organic light emitting display device is provided. The organic light emitting display device comprises a plurality of pixel areas including at least a first pixel area and a second pixel area adjacent to the first pixel area, the first pixel area including a first organic light emitting element, and the second pixel area including a second organic light emitting element. In one embodiment, the method comprises forming a partition over a substrate. The method further comprises substantially simultaneously forming over the substrate a first anode of the first organic light emitting element, a second anode of the second organic light emitting element, and an auxiliary electrode between the first pixel area and the second pixel area and over the partition. An organic emission layer is formed over the first anode and over the second anode. A first conductive element is formed over the organic emission layer and the auxiliary electrode where the first conductive element is electrically connected to the auxiliary electrode.

In another embodiment, a method of manufacturing an organic light emitting display device is provided. The organic light emitting display device comprises a plurality of pixel areas including at least a first pixel area and a second pixel area adjacent to the first pixel area, the first pixel area including a first organic light emitting element, and the second pixel area including a second organic light emitting element. The method comprises substantially simultaneously forming over a substrate a first anode of the first organic light emitting element, a second anode of the second organic light emitting element, and an auxiliary electrode between the first pixel area and the second pixel area. A supplemental conductive layer and a partition are formed over the auxiliary electrode where a portion of the supplemental conductive element is in direct contact with the auxiliary electrode. An organic emission layer is formed over the first anode and over the second anode. Furthermore, a first conductive element is formed over the organic emission layer and the supplemental conductive layer where the first conductive element is electrically connected to the auxiliary electrode via the supplemental conductive layer.

Additional features of the invention will be set forth in the description, which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The above and other aspects, features and other advantages of the present invention will be more clearly understood from the following detailed description taken in conjunction with the accompanying drawings.

Figure 1A:
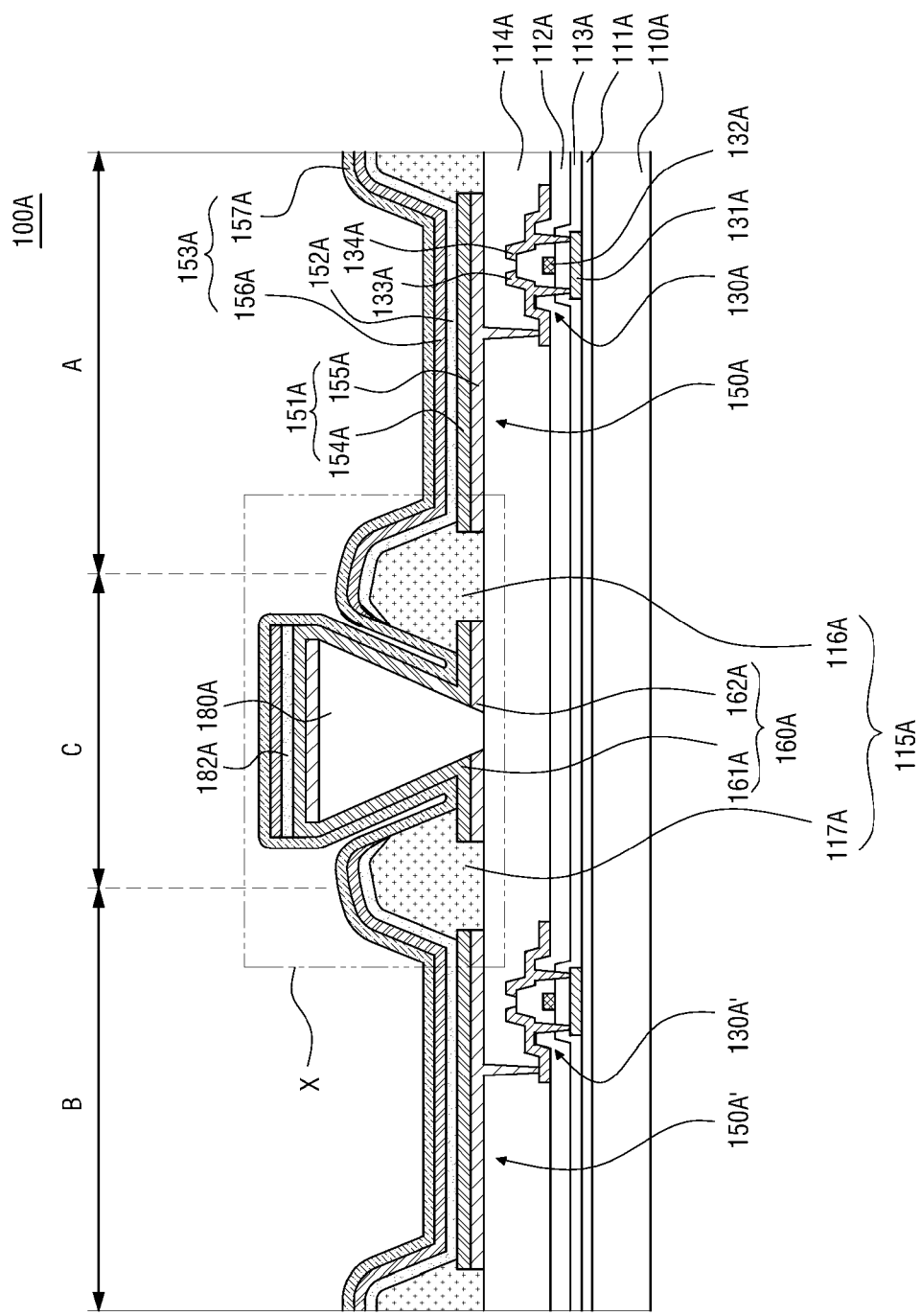
FIG. 1A is a cross-sectional view of an exemplary organic light emitting display device configured for improving electric connection between a cathode and an auxiliary electrode according an embodiment of the present disclosure.

In the figures, size and thickness of each element are arbitrarily illustrated for convenience of description, and the present invention is not necessarily limited to those illustrated in the figures.

DETAILED DESCRIPTION

Various advantages and features of the present invention and methods accomplishing thereof will become apparent from the following description of exemplary embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

In the following description, numerous specific details are set forth, such as particular structures, components, materials, dimensions, processing steps and techniques, in order to provide an understanding of the various embodiments of the present disclosure. In other instances, well-known structures and processing steps have not been described in detail in order to avoid obscuring the present disclosure. Further, descriptions regarding the structures similar to the ones described in the previous parts of the present disclosure have been omitted for brevity.

Indicating that elements or layers are "on" other elements or layers include both a case in which the corresponding elements are directly above other elements and a case in which the corresponding elements are intervened with other layers or elements. In contrast, when an element is referred to as being "directly on" another element, there are no intervening elements present. It will also be understood that when an element is referred to as being "electrically connected" to another element, it can be directly connected to the other element or connected via some intervening elements may be present therebetween. In contrast, when an element is referred to as being "directly connected" to or "in contact" with another element, it should be understood that there are no intervening elements therebetween.

Further, it will be understood that when an element is referred to as being "overlapped" with another element, one element can be positioned above the other element or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

In this specification, the term "organic light emitting device", which may be referred to herein after as "the display device," is used as the generic term for the organic light emitting diode panel and the display device employing such organic light emitting diode panel. Generally, there are two different types of an organic light emitting display device, a white organic light emitting type and a RGB organic light emitting type. In the white organic light emitting type, each of the sub pixels of a pixel is configured to emit white light, and a set of color filters is used to filter the white light to generate red, green and blue light at the corresponding sub pixel. The white organic light emitting type may also include a sub pixel configured without a color filter to form a sub pixel for generating white light. In the RGB organic light emitting type, the organic emission layer in each of the sub pixel is configured to emit light of a designated color. For example, a pixel includes a red sub pixel with an organic emission layer that emits red light, a green sub pixel with an organic emission layer that emits green light, and a blue sub pixel with an organic emission layer that emits blue light. To generate white light from the pixel, all three sub pixels needs to emit their designated colored light.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or executed together through an association relationship.

Exemplary embodiments of the present application will now be described in greater detail by referring to the following discussion and drawings that accompany the present disclosure.

Figure 1B:
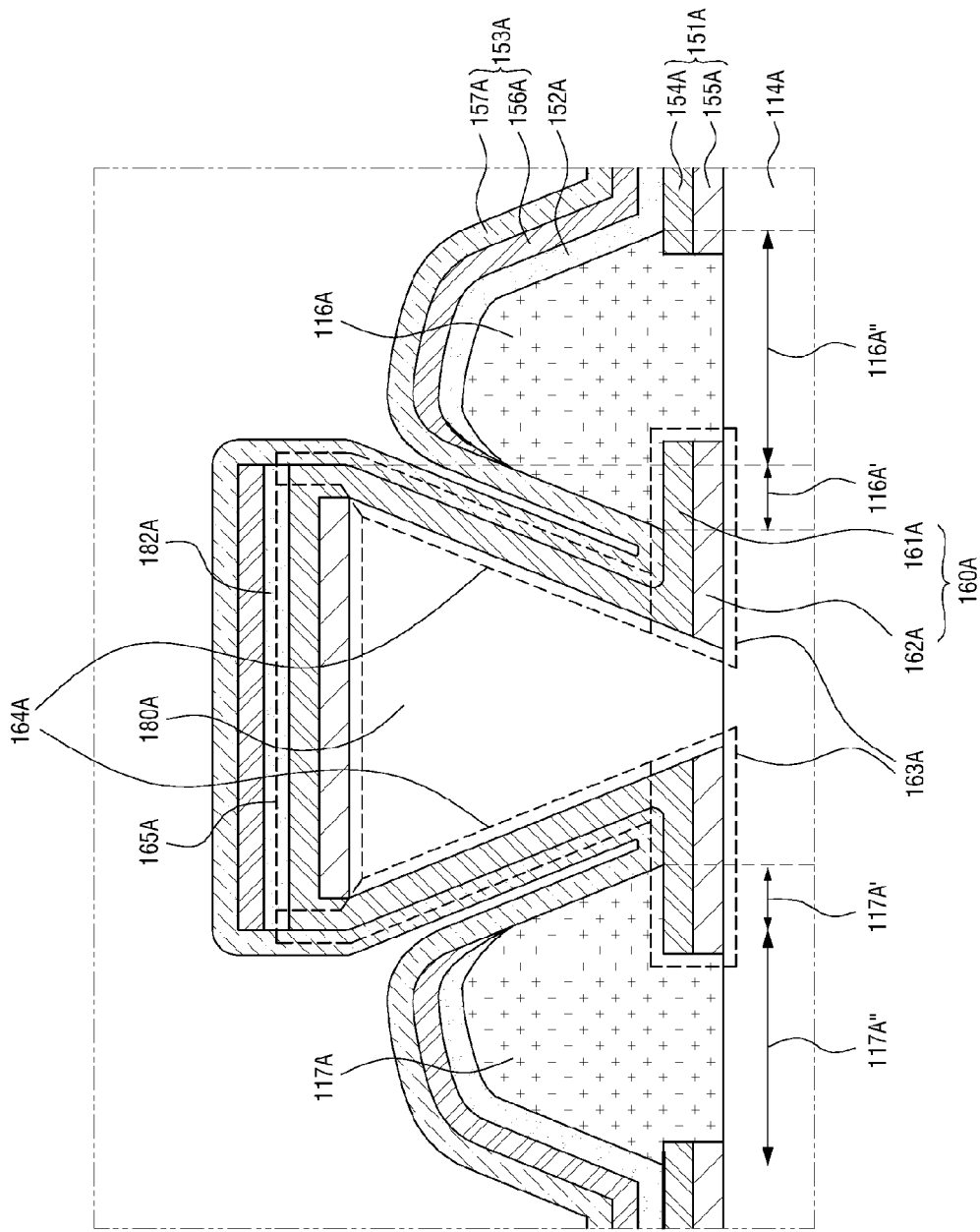
FIGS. 1B and 1C illustrate enlarged view of the region X marked in FIG. 1A.

FIG. 1A is a cross-sectional view of an exemplary organic light emitting display device for improving electrical connection between a cathode and an auxiliary electrode according to an embodiment of the present disclosure. FIG. 1B depicts an enlarged view of the region X shown in FIG. 1A.

Referring to FIGS. 1A and 1B, an organic light emitting display device 100A includes a substrate 110A having a first sub pixel area A and a second sub pixel area B, and an intermediate area C between the first sub pixel area A and the second sub pixel area B. In the present disclosure, the term "first sub pixel area A" is used to refer any one sub pixel area within a pixel area. For instance, the first sub pixel area A can be any one of a red sub pixel area, a green sub pixel area, a blue sub pixel area and a white sub pixel area. The term "second sub pixel area B" is used to refer any one sub pixel area disposed next to the first sub pixel area A. Similar to the first sub pixel area A, the second sub pixel area B can be any one of the red, green, blue, and white sub pixel areas. The first sub pixel area A and the second sub pixel area B can be part of a same pixel or they may be part of separate pixels. Further, it should be noted that the terms "pixel area" and "sub pixel area" are used interchangeably with the terms "pixel" and "sub pixel", respectively.

In the first sub pixel area A, the first thin film transistor 130A and the first organic light emitting element 150A are disposed therein. In the second sub pixel area B, the second thin film transistor 130A' and the second organic light emitting element 150A' are disposed therein. The organic light emitting display device 100A further includes an auxiliary electrode 160A and a partition 180A as depicted in FIG. 1A.

In detail, the first thin film transistor 130A is formed in the first sub pixel area A, and the second thin film transistor 130A' is formed in the second sub pixel area B. The first thin film transistor 130A includes an active layer 131A formed on a buffer layer 111A, a gate electrode 132A formed on a gate insulating layer 113A, and a source electrode 133A and a drain electrode 134A formed on an interlayer insulating layer 112A, and the second thin film transistor 130A' also includes an active layer, a gate electrode, and a source electrode and a drain electrode similar to the first thin film transistor 130A. In FIG. 1A, only a driving thin film transistor for the organic light emitting display device 100A is illustrated. However, it should be appreciated that additional TFTs serving similar and/or extra functionalities can be employed in any one or more of the individual sub pixel areas. Also, while the TFTs depicted in the figures of the present disclosure have a co-planar structure, the type of TFTs is not limited as such. The organic light emitting display device of the present disclosure can employ TFTs having an inverted-staggered type TFTs.

A planarization layer 114A is formed on the first thin film transistor 130A and the second thin film transistor 130A'. The planarization layer 114A is a layer of planarizing upper sides of the first thin film transistor 130A and the second thin film transistor 130A', and has contact holes exposing respective source electrodes of the first thin film transistor 130A and the second thin film transistor 130A'. Since FIG. 1A illustrates a case where the thin film transistor is an n-type, the planarization layer 114A has the contact holes exposing the respective source electrodes of the first thin film transistor 130A and the second thin film transistor 130A'.

The first organic light emitting element 150A and the second organic light emitting element 150A' are formed on the planarization layer 114A in the first sub pixel area A and the second sub pixel area B, respectively. The anode 151A and the organic emission layer 152A are disposed in the first sub pixel area A. Although not designated with numerals, an anode (i.e., a second anode) and an organic emission layer (i.e., a second organic emission layer) of the second organic light emitting element 150A' are disposed in the second sub pixel area B as well. As shown in FIG. 1A, the cathode 153A is disposed on the first sub pixel area A, the second sub pixel area B and the intermediate area C. Accordingly, the first organic light emitting element 150A includes the anode and the organic emission layer disposed in the first sub pixel area A and the cathode 153A. Similarly, the second organic light emitting element 150A' includes the anode and the organic emission layer disposed in the second sub pixel area B and the cathode 153A.

The anode 151A may be formed as a stack of conductive layers. For example, the anode 151A includes a reflective layer 155A (i.e., a first conductive layer) electrically connected to the source electrode 133A of the first TFT 130A. The reflective layer 155A is a conductive layer capable of reflecting light. The anode 151A further includes a transparent conductive layer 154A (i.e., second conductive layer) formed on the reflective layer 155A. The transparent conductive layer 154A is made of a conductive material having a high work function for supplying a hole to the organic emission layer 152A. For instance, the transparent conductive layer 154A may be formed of transparent conductive oxide (TCO) including, but are not limited to, indium tin oxide (ITO), indium zinc oxide (IZO), indium tin zinc oxide (ITZO), zinc oxide, tin oxide, and a combination thereof.

Further, the cathode 153A includes a metal layer 156A and a transparent conductive layer 157A. The metal layer 156A is made of a conductive material having a low work function for supplying an electron to the organic emission layer 152A. The material for forming the metal layer 156A may include, but not limited to, silver (Ag), titanium (Ti), aluminum (Al), molybdenum (Mo), or an alloy of silver (Ag) and magnesium (Mg). Even though the material forming the metal layer 156A is opaque and has some degree of light reflecting property, the light can be transmitted through the metal layer 156A if it is formed with sufficiently thin thickness, for example, 200 Å or less. As such, the cathode 153A can be formed to have a thickness of hundreds Å or less, for example, 200 Å or less.

The transparent conductive layer 157A (i.e., a first conductive element) is formed on the metal layer 156A (i.e., a second conductive element) and made of a material having high step coverage. Although not labeled in FIG. 1A, the metal layer of the second organic light emitting element 150A' in the sub-pixel area B is an example of a third conductive element. The transparent conductive layer 157A may be formed of oxide metal material including, but not limited to, indium tin oxide (ITO), indium zinc oxide (IZO), indium tin zinc oxide (ITZO), zinc oxide, tin oxide, and a combination thereof. To have sufficient electrical conductivity, the transparent conductive layer 157A may be formed with a thickness of about 100 Å or more.

In some embodiments, the cathode 153A can be formed of carbon nano tube (CNT) and/or graphene based composite materials, which can provide excellent electrical conductivity and transparency. Such carbon based composite materials may include metallic material to provide the low work function characteristic to the cathode 153A.

The second organic light emitting element 150A' is formed on the planarization layer 114A formed in the second sub pixel area B. The configuration of the second organic light emitting element 150A' is the same as the configuration of the first organic light emitting element 150A.

The partition 180A is formed on the planarization layer 114A in an intermediate area C between the first organic light emitting element 150A and the second organic light emitting element 150A', and more specifically, between the first anode of the first organic light emitting element 150A and the second anode of the second organic light emitting element 150A'. The partition 180A insulates the organic emission layer 152A of the first sub pixel area A from the organic emission layer of the second sub pixel area B.

The partition 180A is particularly useful for the white organic light emitting display device. Unlike the RGB organic light emitting type display device requiring a fine metal mask (FMM) to pattern the organic emission layer in each sub pixel area, the organic emission layer for the white organic light emitting type display device can be deposited over the large area of the display device without using the FMM. However, when the organic emission layer 152A for the white organic light emitting type display device is deposited over the auxiliary electrode 160A, the cathode 153A may not contact the auxiliary electrode 160A due to the organic emission layer 152A interposed between the cathode 153A and the auxiliary electrode 160A.

Accordingly, the partition 180A has a shape that is capable of isolating the organic emission layers 152A of the first and second sub pixel areas A and B, and to expose at least some portion of the auxiliary electrode 160A. For instance, the partition 180A may have a reverse tapered shape as shown in FIGS. 1A and 1B. Referring to FIG. 1B, a cross-sectional width of the partition 180A is greater at the portion of the partition 180A away from the planarization layer 114A, making the partition 180A wider at its upper portion and narrower at its lower portion that is opposite the upper portion. That is, the partition includes a first end (i.e., the upper portion) and a second end (i.e., the lower portion) that is opposite the first end. The exposed parts of the auxiliary electrode 160A allow for the electrical connection between the cathode 153A and the auxiliary electrode 160A.

In the example shown in FIGS. 1A and 1B, the lower surface of the partition 180A directly contacts the upper surface of the planarization layer 114A. The partition 180A and the planarization layer 114A are made of materials having similar characteristics to promote stronger adhesion between each other. For example, the partition 180A and the planarization layer 114A may include the same organic material. In this specification, the characteristics of two materials being similar to each other means that two materials have similar coupling characteristics.

The auxiliary electrode 160A is formed on the planarization layer 114A formed in the intermediate area C. The auxiliary electrode 160A is formed of a conductive material that can compensate the voltage drop caused by the high electrical resistivity of the cathode 153A.

In some embodiments, the auxiliary electrode 160A can be formed of the same materials and/or structure as the anode 151A. As described above, the anode 151A may be formed as a stack of conductive layers, including the transparent conductive layer 154A and the reflective layer 155A. Likewise, the auxiliary electrode 160A may also be formed as a stack of conductive layers, including a transparent conductive layer 161A and a reflective layer 162A. For simpler and faster manufacturing of the organic light emitting display device 100A, the transparent conductive layer 161A of the auxiliary electrode 160A and the transparent conductive layer 154A of the anode 151A may be formed with the same material and at the same stage of the manufacturing process. Likewise, the reflective layer 162A of the auxiliary electrode 160A and the reflective layer 155A of the anode 151A may be formed with the same material and at the same stage of the manufacturing process. The layers of the auxiliary electrode 160A and the anode 151A may be formed with the same thickness.

In the embodiment depicted in FIGS. 1A and 1B, the auxiliary electrode 160A is formed over the partition 180A such that the auxiliary electrode 160A covers the side surfaces as well as the upper (i.e., a top) surface of the partition 180A. The auxiliary electrode 160A includes a first portion 163A formed on the upper surface of the planarization layer 114A, a second portion 164A formed on the side surfaces of the partition 180A, and a third portion 165A formed on the upper surface of the partition 180A, which are illustrated by a dotted line in FIG. 1B. The first portion 163A of the auxiliary electrode 160A includes a transparent conductive layer 161A and a reflective layer 162A, the second portion 164A of the auxiliary electrode 160A includes only the transparent conductive layer 161A, and the third portion 165A of the auxiliary electrode 160A includes the transparent conductive layer 161A and the reflective layer 162A.

When forming the auxiliary electrode 160A, the reflective layer 162A and the transparent conductive layer 161A are deposited over the first sub pixel area A, the second sub pixel area B and the intermediate area C. Generally, the metallic material used for the reflective layer 162A has low step coverage, while the transparent conductive oxide-based material used for the transparent conductive layer 161A has high step coverage. As such, the low step coverage of the reflective layer 162A and the shape of the partition 180A makes it difficult for the reflective layer 162A of the auxiliary electrode 160A to be deposited on the part of the planarization layer 114A under the wide upper portion (i.e., roof) of the partition 180A and the side surfaces of the partition 180A. In contrast, the higher step coverage of the transparent conductive layer 161A allows it to be formed on the planarization layer 114A overlapping (i.e., covering) with the wide upper portion of the partition 180A as well as the side surfaces of the partition 180A.

The auxiliary electrode 160A is extended in one direction on the substrate 110A, and an end of the auxiliary electrode 160A is electrically connected to a pad portion formed in a non-pixel area to receive a predetermined voltage from the outside. The predetermined voltage may be, for example, a ground GND voltage.

Various factors need to be considered to determine the dimension (e.g., length, width and thickness) and the layout of the auxiliary electrode 160A within the display device. In particular, the surface resistance value of the cathode 153A is an important factor for determining the dimension and the layout of the auxiliary electrode 160A. The surface resistance value of the cathode 153A can be calculated from the electrical property of the material forming the cathode 153A and the size of the cathode 153A employed in the display device. Based on the surface resistance of the cathode 153A, the dimension of the auxiliary electrode 160A and the disposition interval of the auxiliary electrode 160A, which are sufficient for reducing the voltage drop, can be determined.

A bank 115A is formed on the planarization layer 114A. The bank 115A is disposed between the adjacent sub pixel areas A and B to divide the adjacent sub pixel areas, and disposed between the sub pixel area and the intermediate area C to divide the sub pixel area and the intermediate area C.

The bank 115A is formed at both sides of the auxiliary electrode 160A and both sides of the anode 151A. As illustrated in FIG. 1B, the bank 115A includes a first bank 116A covering one side of the auxiliary electrode 160A and one side of the anode 151A of the first sub pixel area A, and a second bank 117A covering the other side of the auxiliary electrode 160A and one side of the anode of the second sub pixel area B. The first bank 116A includes a first region 116A' overlapping with the auxiliary electrode 160A formed on the upper side and the side of the partition 180A, and a second region 116A" which does not overlap with the auxiliary electrode 160A formed on the upper side and the side of the partition 180A. The second bank 117A includes a first region 117A' overlapping with the auxiliary electrode 160A formed on the upper side and the side of the partition 180A, and a second region 117A" which does not overlap with the auxiliary electrode 160A formed on the upper side and the side of the partition 180A.

The organic emission layers 152A and 182A are formed on the first sub pixel area A, the second sub pixel area B, and the intermediate area C. The organic emission layer 152A in the sub pixel areas A and B are formed by depositing an organic light emitting material over the sub pixel area A, the intermediate area C and the sub pixel area B. The organic emission layer 152A is formed in the first sub pixel area A, the second sub pixel area B, the second region 116A" of the first bank 116A, and the second region 117A" of the second bank 117A.

The material used as the organic emission layer 152A generally has low step coverage. As mentioned above, the shape of the partition 180A prevents the organic emission layer from covering the area under the wide upper portion (i.e., roof) of the partition 180A as well as the side surfaces of the partition. More specifically, the auxiliary electrode 160A on the side surfaces of the partition 180A is not covered by the organic emission layer 152A. These exposed parts of the auxiliary electrode 160A, creates convenient contact points for the cathode 153A and the auxiliary electrode 160A.

In particular, the cathode 153A is formed on the first sub pixel area A, the second sub pixel area B, and the intermediate area C. The metal layer 156A of the cathode 153A is deposited over the first sub pixel area A, the second sub pixel area B, and the intermediate area C. However, the material used for the metal layer 156A generally has low step coverage, and as such, the metal layer 156A of the cathode 153A is not formed over the auxiliary electrode 160A under the roof of the partition 180A. Also, the metal layer 156A is not deposited over the auxiliary electrode 160A on the side surfaces of the partition 180A.

In contrast, the material used for the transparent conductive layer 157A has higher step coverage than the metal layer 156A. Accordingly, the transparent conductive layer 157A of the cathode 153A is continuously deposited throughout the sub pixel area A, the intermediate area C and the sub pixel area B. More specifically, the transparent conductive layer 157A is deposited over and in contact with the auxiliary electrode 160A exposed under the roof of the partition 180A as well as the auxiliary electrode 160A on the side surfaces of the partition 180A.

It should be noted that the shape of the partition 180A may not be formed accurately during the manufacturing process to expose the portions of the auxiliary electrode 160A under the roof of the partition 180A. When the organic emission layer covers the first portion 163A of the auxiliary electrode 160A (i.e., the part of the auxiliary electrode on the surface of the planarization layer), the cathode 153A may not be electrically connected to the auxiliary electrode 160A. However, the exposed parts of the auxiliary electrode 160A on the side surfaces of the partition 180A ensure the contact between the cathode 153A and the auxiliary electrode 160A.

Figure 1C:
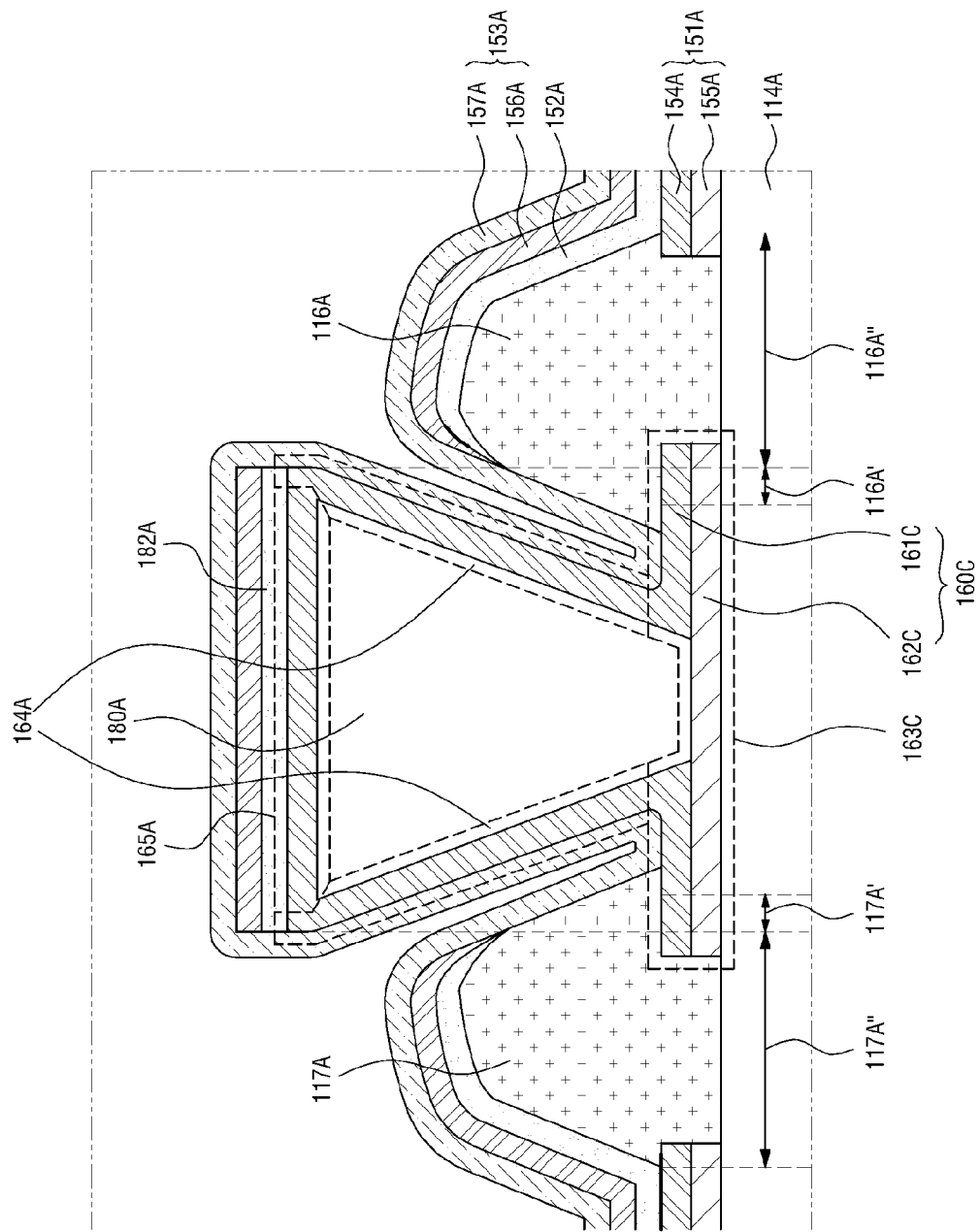

FIG. 1C is illustrates an embodiment of the organic light emitting display device with an alternative configuration of the partition 180A. In this example, the reflective layer 162C of the auxiliary electrode 160C is formed on the planarization layer 114A, and the partition 180A is formed on the reflective layer 162C of the auxiliary electrode 160C. The reflective layer 162C includes a first surface and a second surface that is opposite the first surface. The first surface of the reflective layer 162C is in direct contact with the partition 180A as shown in FIG. 1C and the second surface of the reflective layer 162C is in direct contact with the planarization layer 114A. The transparent conductive layer 161C of the auxiliary electrode 160C covers the upper surface of the reflective layer 162C of the auxiliary electrode 160C, and further covers the upper and side surfaces of the partition 180A. Accordingly, the partition 180A directly contacts the upper surface of the reflective layer 162C.

In this setting, the first portion 163C of the auxiliary electrode 160C includes the reflective layer 162C and the transparent conductive layer 161C formed on the reflective layer 162C. The second portion 164A of the auxiliary electrode 160C includes only the transparent conductive layer 161C. Lastly, the third portion 165A of the auxiliary electrode 160C includes the transparent conductive layer 161C and the reflective layer 162C.

If the partition is not attached securely, the partition may be displaced from its original position and may disconnect the cathode from the auxiliary electrode. Accordingly, in the example depicted in FIG. 1B, the partition 180A is formed directly on the planarization layer 114A, and is made of a material having a similar characteristic as the planarization layer 114A to promote stronger adhesion between each other. Similarity in the coupling characteristic of materials forming the partition 180A and the planarization layer 114A provides stronger adhesion between molecules of the materials forming the partition 180A and the planarization layer 114A. As such, the partition 180A may be securely placed within the organic light emitting display device 100A in comparison to the case where the partition 180A is formed directly on a material made of metal.

In the present disclosure, the anode 151A is described as including the transparent conductive layer 154A and the reflective layer 155A. However, it should be appreciated that the anode 151A may be configured only with the transparent conductive layer 154A for supplying hole to the organic emission layer 152A, and may employ a reflective layer that does not provide the electrical functionality of the anode. Likewise, although the cathode 153A is described as including the metal layer 156A and the transparent conductive layer 157A, it should be appreciated that the cathode 153A may be configured only with the metal layer 156A supplying the electrons. In such cases, the transparent conductive layer 157A may be defined as a separate configuration from independent from the cathode 153A.

Figure 2A:
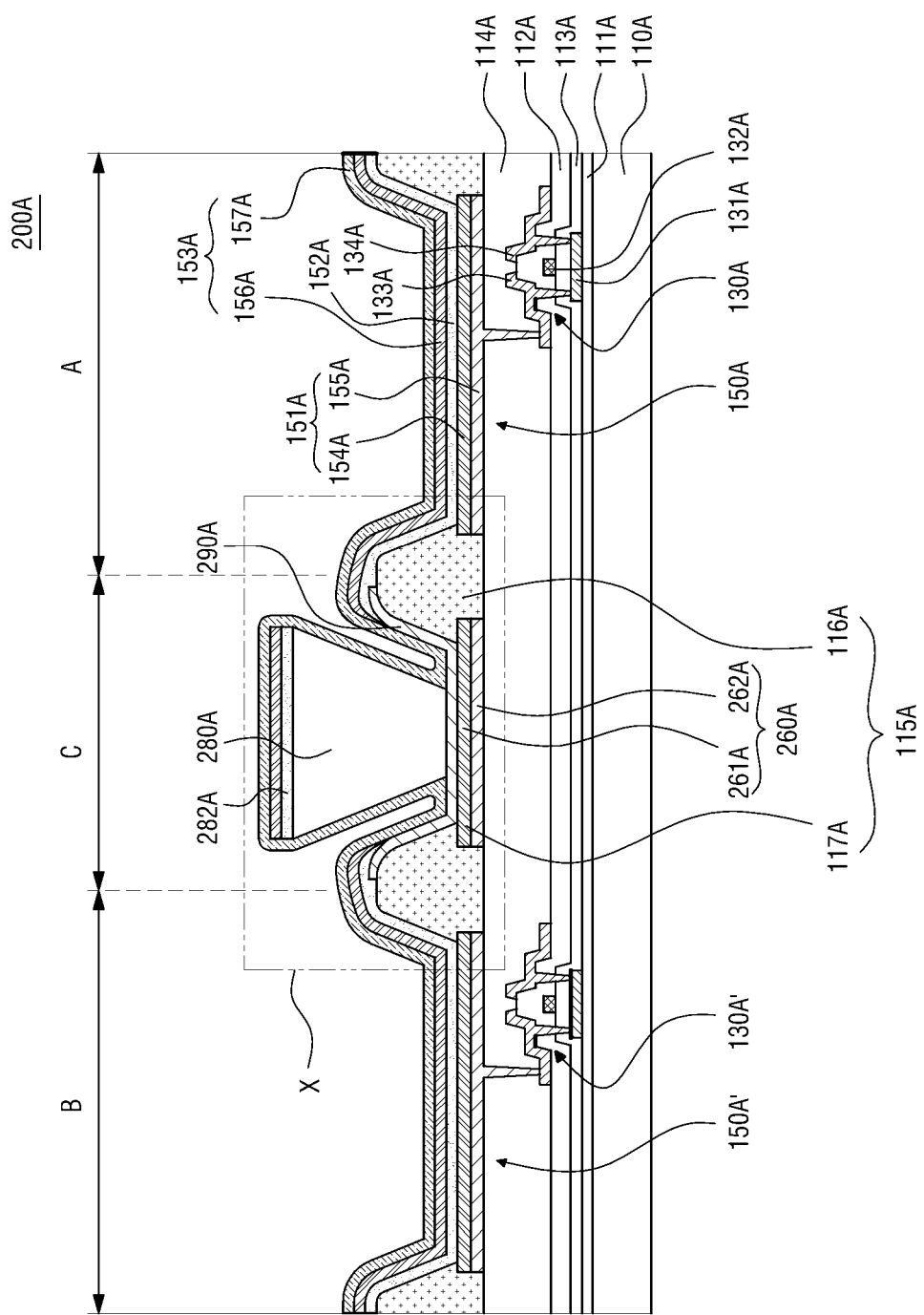
FIG. 2A is a cross-sectional view of an exemplary organic light emitting display device adopting a supplemental conductive layer for reinforcing the functionality of an auxiliary electrode, according to an embodiment of the present disclosure.
Figure 2B:
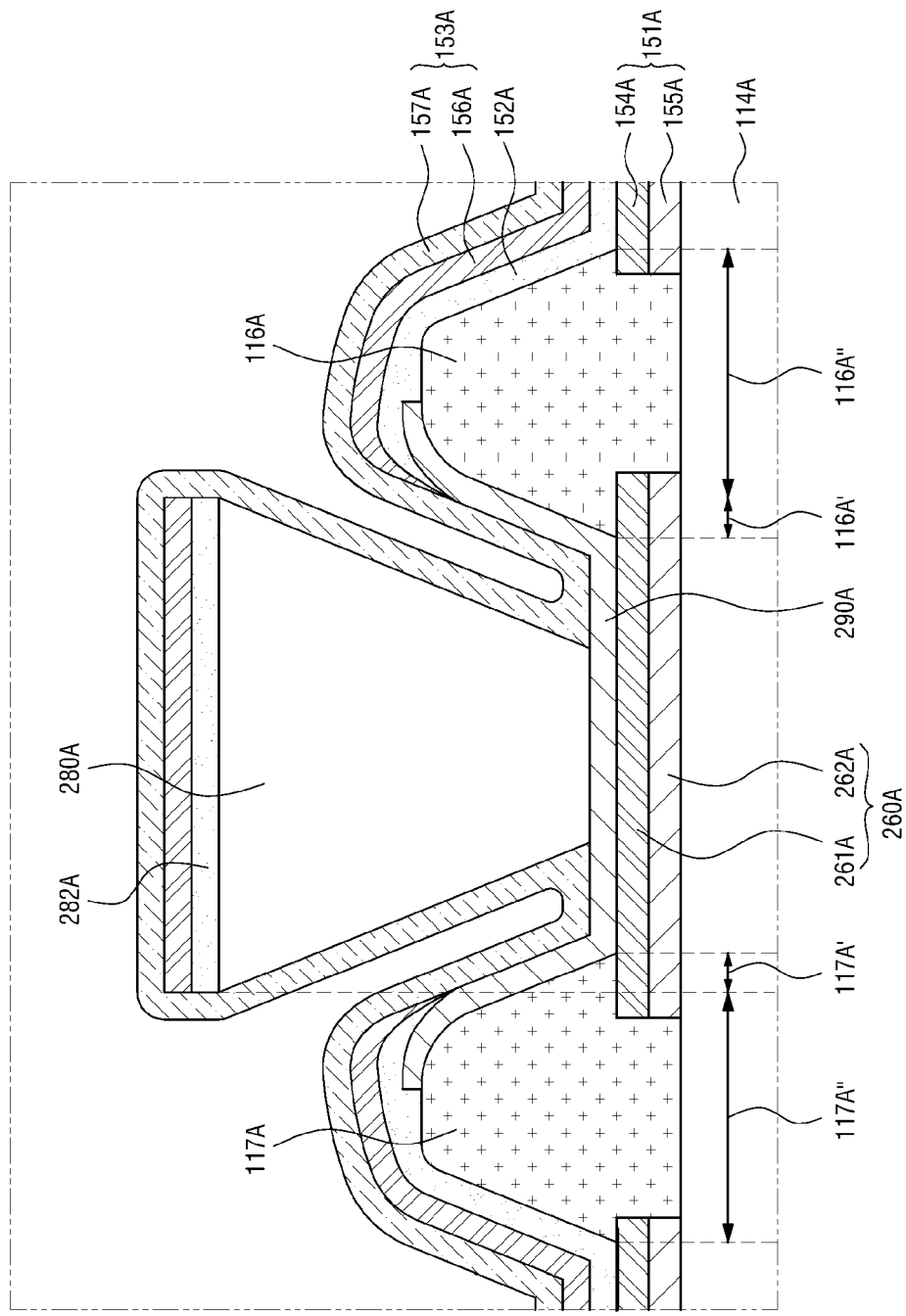
FIGS. 2B and 2C illustrate enlarged view of the region X marked in FIG. 2A.

FIG. 2A is a cross-sectional view of an organic light emitting display device adopting a supplemental conductive layer for reinforcing the functionality of the auxiliary electrode. FIG. 2B illustrates an enlarged view of a region X shown in FIG. 2A. The substrate 110A, the first thin film transistor 130A, the second thin film transistor 130A', the first organic light emitting element 150A, and the second organic light emitting element 150A' of FIGS. 2A and 2B are substantially the same as those described in conjunction with FIG. 1A. Accordingly, the descriptions of these elements will be omitted.

In the embodiment shown in FIG. 2A, the auxiliary electrode 260A is formed on the upper surface of a planarization layer 114A in the intermediate area C. The auxiliary electrode 260A includes a reflective layer 262A and a transparent conductive layer 261A, and the reflective layer 262A and the transparent conductive layer 261A of the auxiliary electrode 260A are formed of the same material as a reflective layer 155A and a transparent conductive layer 154A of the anode 151A. Banks 115A are formed on both sides of the auxiliary electrode 260A and both sides of the anode 151A.

The supplemental conductive layer 290A is formed on the auxiliary electrode 260A and the banks 115A. More specifically, the supplemental conductive layer 290A is formed to be in contact with the upper surface of the auxiliary electrode 260A, and further to cover at least some portion of the surface of the first bank 116A and the second bank 117A. In order to reduce the voltage drop caused by the high electrical resistivity of the cathode 153A, the supplemental conductive layer 290A may be made of a low-resistive conductive metal material.

The partition 280A is formed on the supplemental conductive layer 290A. Thus, the supplemental conductive layer 290A is formed between the partition 280A and the transparent conductive layer 261A of the auxiliary electrode 260A. An organic layer 282 is formed on the partition 280A. In one embodiment, the organic layer 282 is non functional and is formed as a byproduct of forming the organic emission layer 152A. As shown in FIG. 2A, the lower surface of the partition 280A directly contacts the upper surface of the supplemental conductive layer 290A. In order to prevent the organic emission layer 152A from entirely covering the supplemental conductive layer 290A, the partition 280A has the reverse tapered shape having greater width at the portion of the partition 280A. As mentioned, the high step coverage of the transparent conductive layer 157A of the cathode 153A allows it to be in contact with the supplemental conductive layer 290A formed on the upper surface of the auxiliary electrode 260A. Accordingly, the supplemental conductive layer 290A serves as a bridge for connecting the cathode 153A to the auxiliary electrode 260A. Further, the supplemental conductive layer 290A formed over the banks 115A provides additional contact areas for electrically connecting the cathode 153A and the auxiliary electrode 260A. Since the supplemental conductive layer 290A is formed under the partition 280A, the material for forming the supplemental conductive layer 290A does not require high step coverage. As such, the supplemental conductive layer 290A may have lower electrical resistivity than the transparent conductive layer 261A of the auxiliary electrode 260A. Similarly, the supplemental conductive layer 290A may have lower electrical resistivity than the transparent conductive layer 257A of the cathode 253A.

Figure 2C:
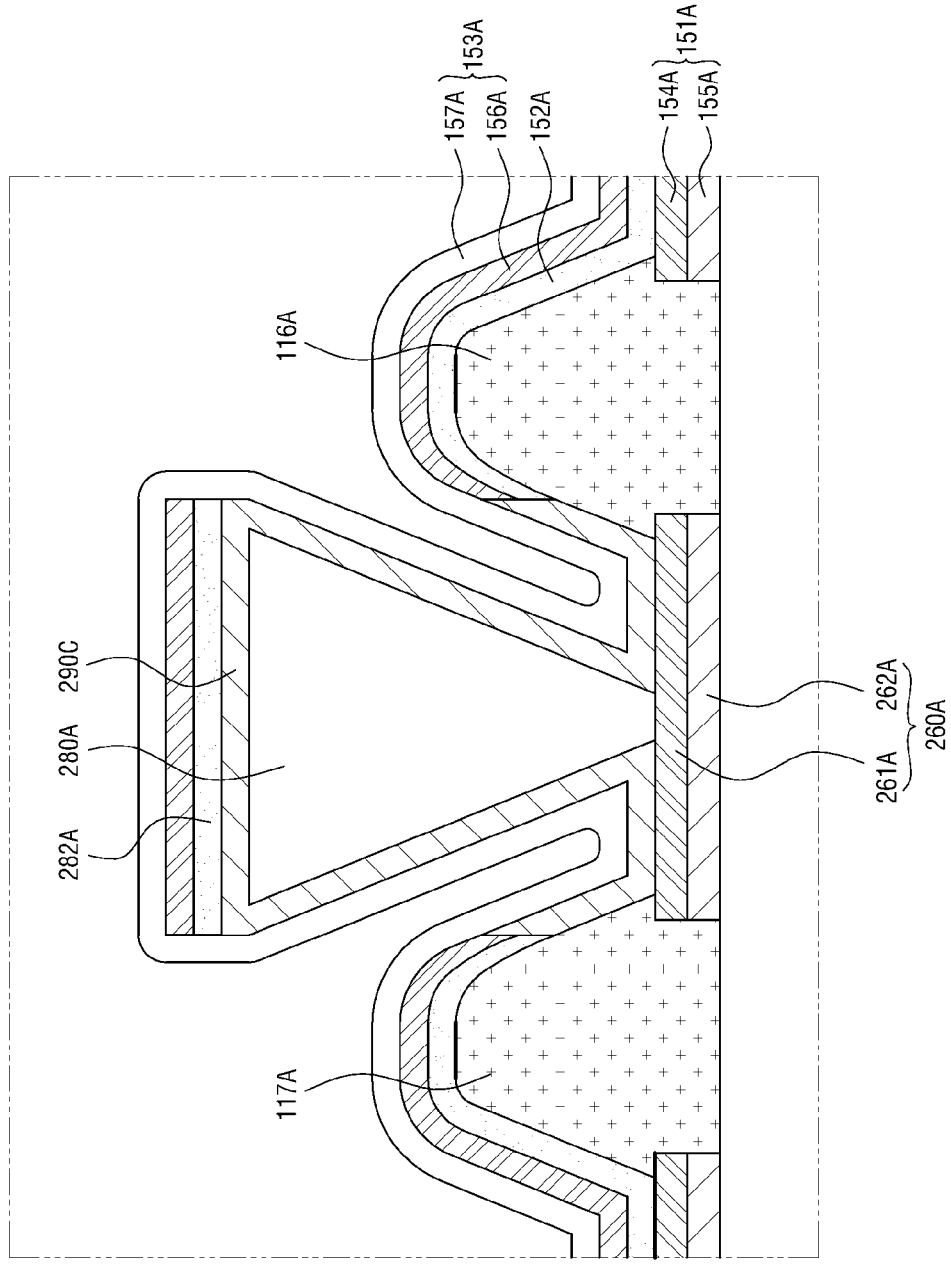

In some embodiments, the supplemental conductive layer 290C may be formed with material having sufficient step coverage to cover the side surfaces and the top surface of the partition 280A as shown in FIG. 2C. In this setting, the area of the supplemental conductive layer 290C for contacting the cathode 153A can be increased further. However, the material with the sufficient step coverage capable of covering the side surfaces of the partition may have higher electrical resistivity than the material with lower step coverage. Accordingly, the configuration of the supplemental conductive layer can vary according to the desired electrical conductivity and the arrangement of the contact area with the cathode.

Figure 3A:
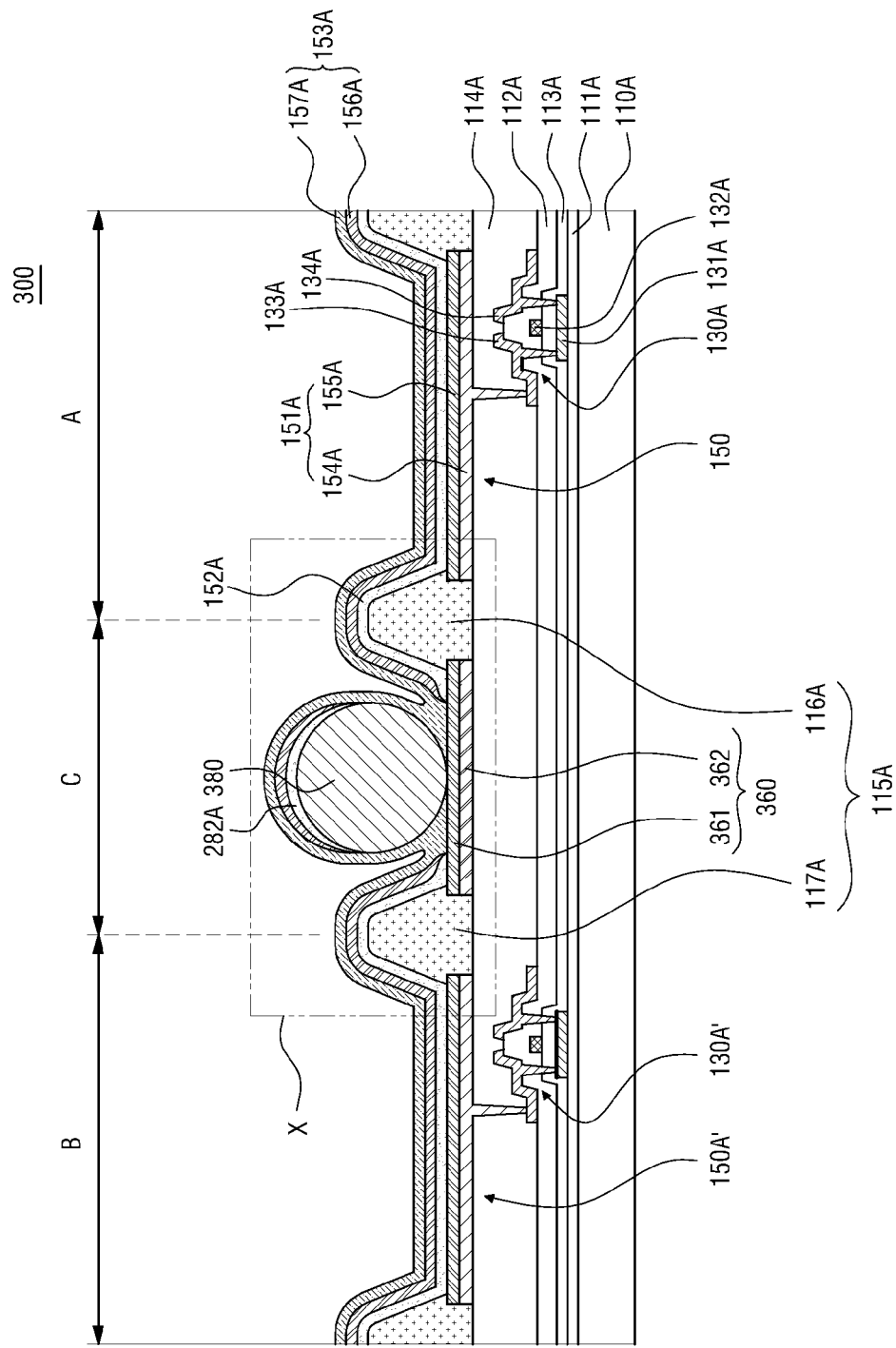
FIG. 3A is a cross-sectional view of an exemplary organic light emitting display device adopting a conductive partition for ensuring the electrical connection between the cathode and the auxiliary electrode, according to an exemplary embodiment of the present disclosure.
Figure 3B:
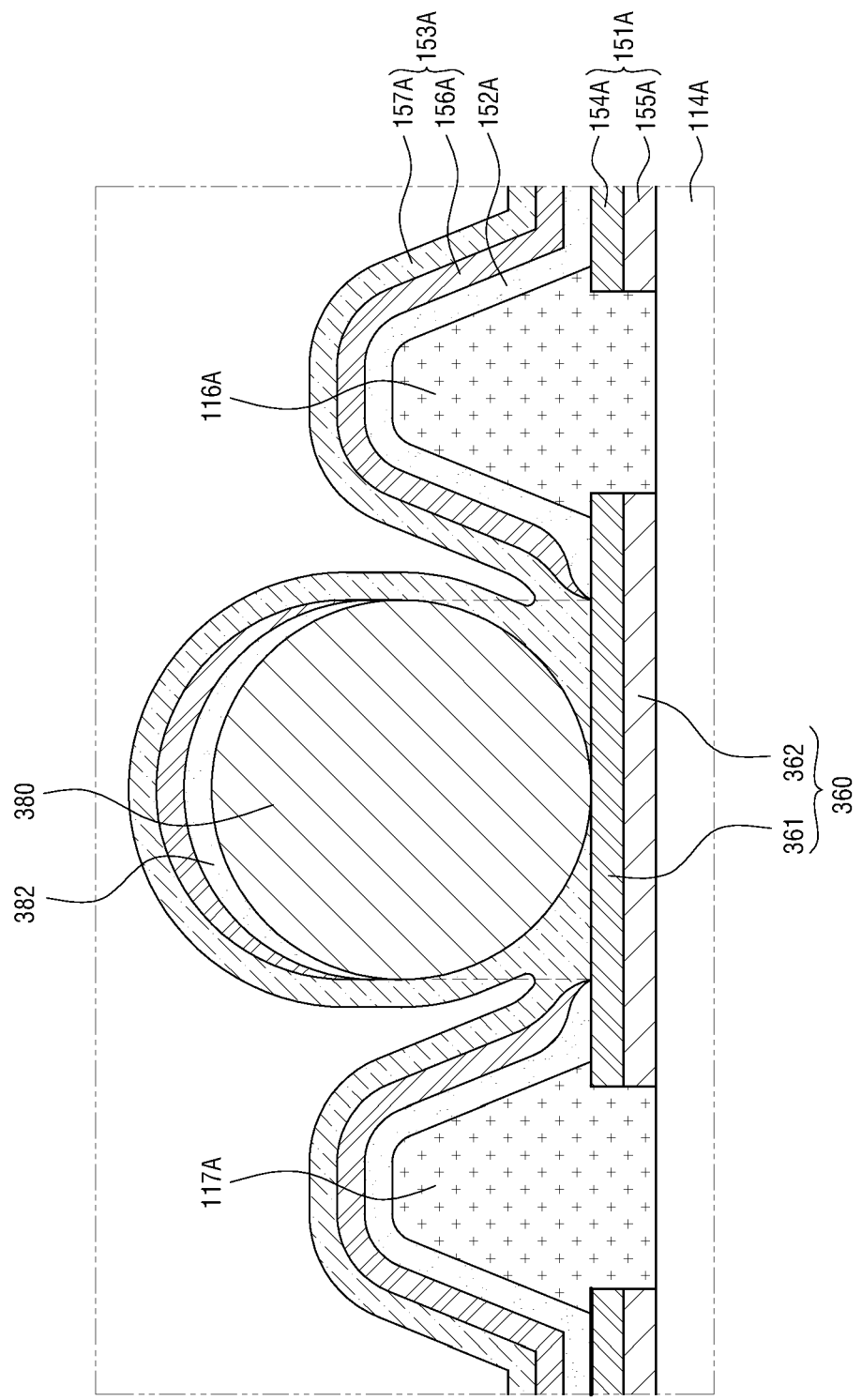
FIG. 3B is illustrates enlarged view of the region X marked in FIG. 3A.

FIG. 3A is a cross-sectional view of an exemplary organic light emitting display device with a conductive partition 380 for facilitating electrical connection between the auxiliary electrode and the cathode, according to an embodiment of the present disclosure. FIG. 3B is illustrates an enlarged view of a region X shown in FIG. 3A. Referring to FIGS. 3A and 3B, an organic light emitting display device 300 includes a substrate 110A, the first thin film transistor 130A, the second thin film transistor 130A', the first organic light emitting element 150A, the second organic light emitting element 150A', and the auxiliary electrode 360, which are substantially the same as those described in conjunction with FIG. 1A. Accordingly, descriptions of these elements will be omitted for brevity.

In FIG. 3A, the conductive partition 380 is formed on the auxiliary electrode 360. The conductive partition 380 has a shape, which can prevent the organic emission layer from fully covering the conductive partition 380. In other words, at least some portion of the conductive partition 380 is exposed without being covered by the organic emission layer. Referring to FIGS. 3A and 3B, the exemplary conductive partition 380 has a cylindrical shape with a circular cross section. The conductive partition 380 is disposed on the auxiliary electrode 360 to directly contact the auxiliary electrode 360. In this case, the cross sectional width of the conductive partition 380 is at its maximum in the middle section. Accordingly, part of the conductive partition 380 below the middle section may not be covered by the organic emission layer 152A. The transparent conductive layer 157A of the cathode 153A contacts the upper side of the auxiliary electrode 360 because of the high step coverage of the material used for the transparent conductive layer 157A of the cathode 153A. Since the conductive partition 380 is in direct contact with the auxiliary electrode 360, the cathode 153A can be electrically connected to the auxiliary electrode 360 through the conductive partition 380.

The conductive partition 380 may be formed by an inkjet printing or nozzle printing method. After the auxiliary electrode 360 and the bank 115A are formed, the conductive partition 380 may be formed by inkjet-printing or nozzle-printing particles made of a low-resistive conductive metal material on the auxiliary electrode 360.

In FIGS. 3A and 3B, the cross section of the conductive partition 380 is the circle, but is not limited thereto and may have various shapes so that the cross sectional width of the conductive partition 380 increases as being further away from the part of the partition 380 contacting the auxiliary electrode 360. For example, the conductive partition 380 may have various shapes such as a reversely tapered shape and a reverse mesa shape. Further, in some embodiments, the conductive partition may have a spherical shape rather than the cylindrical shape as described above.

Even in the organic light emitting display device 300 according to the exemplary embodiment of the present invention, the supplemental conductive layer illustrated in FIGS. 2A to 2C may be adopted. When the supplemental conductive layer is adopted, the supplemental conductive layer is formed between the conductive partition 380 and the auxiliary electrode 360 to electrically connect the conductive partition 380 and the auxiliary electrode 360, and formed on the conductive partition 380 and thus both the conductive partition 380 and the supplemental conductive layer may function as an additional auxiliary electrode.

Figure 4:
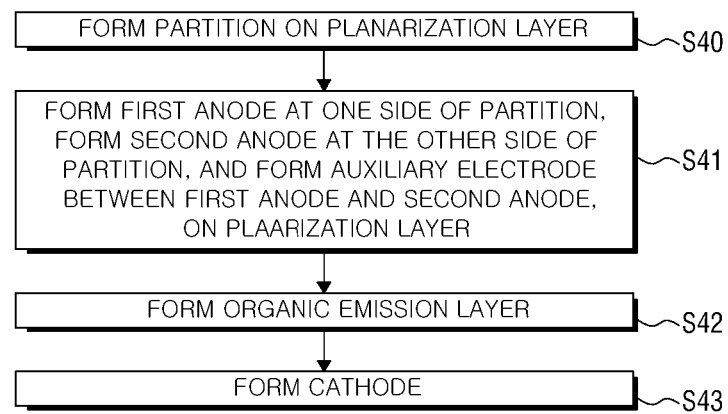
FIG. 4 is a flowchart illustrating a method for manufacturing an organic light emitting display device according to one embodiment of the present disclosure.

FIG. 4 is a flowchart for describing a method for manufacturing an organic light emitting display device for facilitating electric connection between a cathode and an auxiliary electrode according to one embodiment. FIGS. 5A to 5D are cross-sectional views for parts of the organic light emitting display device relevant to the steps described in FIG. 4.

Figure 5A:
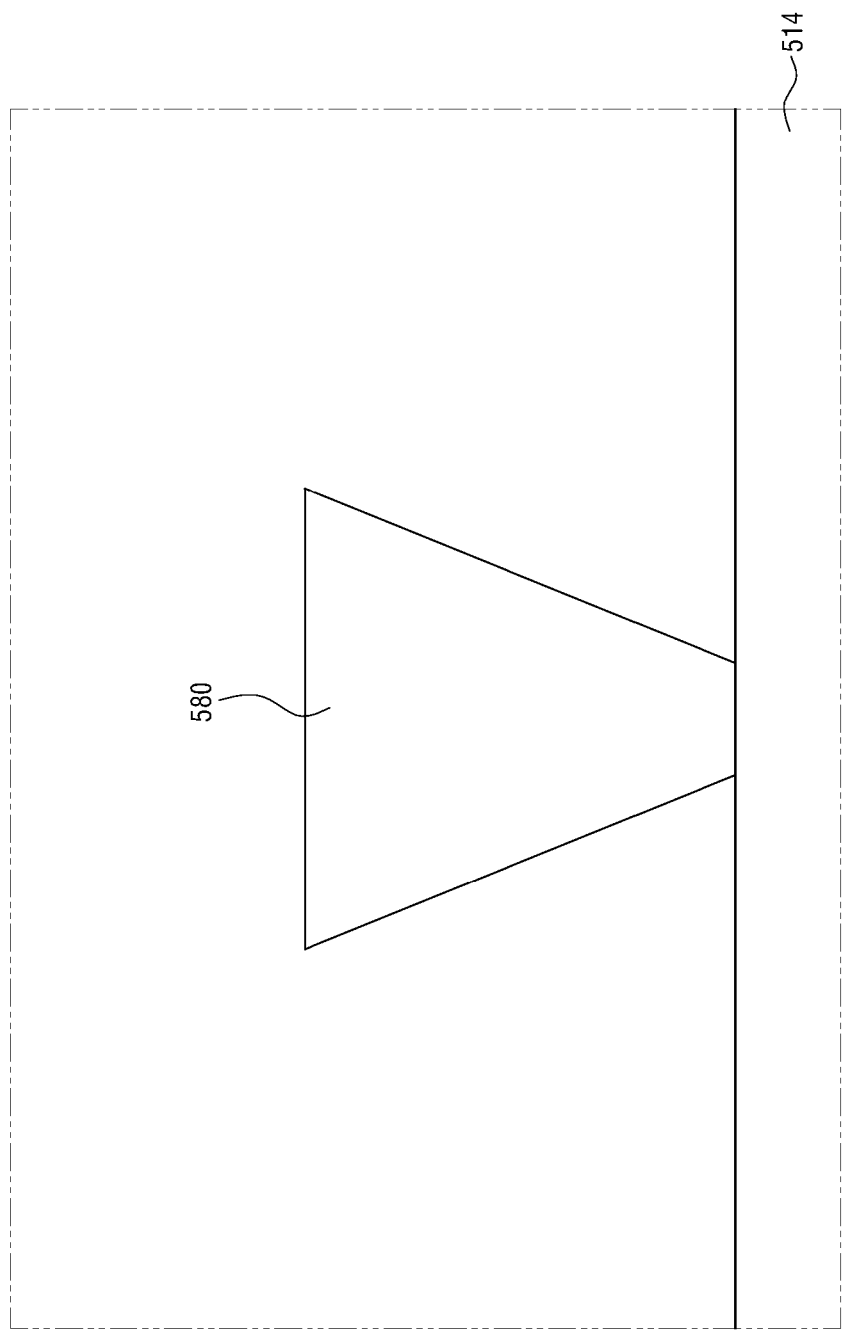
FIGS. 5A to 5D, each illustrates a cross-sectional view of the relevant part of the organic light emitting display device during the manufacturing process described in conjunction with FIG. 4.

Referring to FIG. 5A, forming (S40) a partition 580 on a planarization layer 514 includes forming the partition 580 having a reversely tapered shape. In order to form the partition 580 having the reversely tapered shape, the partition 580 may be formed by partially exposing and developing a negative type photoresist, after coating the negative type photoresist.

Subsequently, anodes 551 are formed at one side and the other side of the partition 580 on the planarization layer 514, and an auxiliary electrode 560 is formed between the anodes 551 (S41). The forming of the anode 551 and the auxiliary electrode 560 will be described in more detail with reference to FIG. 5B.

Figure 5B:
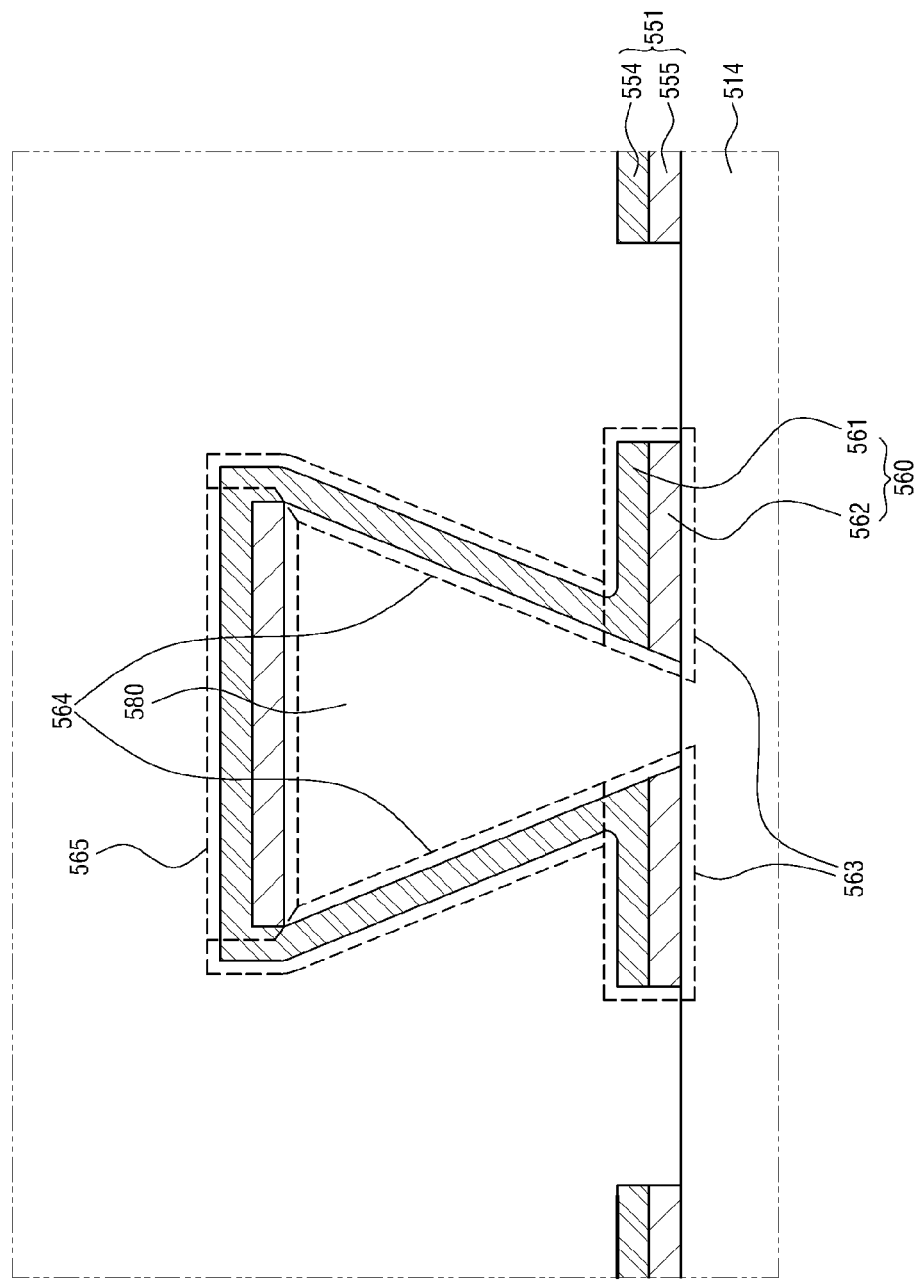

Referring to FIG. 5B, in order to form the anode 551 and the auxiliary electrode 560, a material for the reflective layer is deposited on the entire surface of the planarization layer 514 to create the first conductive layer 555 of the anode 551 and the first conductive layer 562 of the auxiliary electrode 560. Then a material for the transparent conductive layer is deposited on the entire surface of the planarization layer 514 to create the second conductive layer 554 of the anode 551 and the second conductive layer 561 of the auxiliary electrode 560. The material for the reflective layer is a conductive layer having excellent reflectance, and for example, may be a metallic material such as silver (Ag), nickel (Ni), gold (Au), platinum (Pt), aluminum (Al), copper (Cu), and molybdenum/aluminum neodymium (Mo/AlNd), which has low step coverage. Accordingly, the material for the reflective layer 562 is hardly formed on the planarization layer 514 overlapping with the upper side of the partition 580 and the side of the partition 580. However, since the material for the transparent conductive layer is a transparent conductive material having a high work function, and for example, transparent conductive oxide such as indium tin oxide (ITO), indium zinc oxide (IZO), indium tin zinc oxide (ITZO), zinc oxide, and tin oxide, which has high step coverage, the material for the transparent conductive layer 561 is formed on the material for the reflective layer 562 which does not contact the partition 580, and formed on the side and the upper side of the partition 580.

Next, in order to electrically separate the anode 551 and the auxiliary electrode 560 from each other, the material for the reflective layer and the material for the transparent conductive layer formed between the anode 551 and the auxiliary electrode 560 are removed. After the material for the reflective layer and the material for the transparent conductive layer are removed, the anodes 551 are formed at one side and the other side of the partition 580, a first portion 563 of the auxiliary electrode 560 is formed on the upper side of the planarization layer 514, a second portion 564 of the auxiliary electrode 560 is formed on the side of the partition 580, and a third portion 565 of the auxiliary electrode 560 is formed on the upper side of the partition 580.

Next, the organic emission layer 552 is formed over the entire surface of the planarization layer 514 (S42), and the cathode 553 is formed over the entire surface of the planarization layer 514 (S43). The forming of the organic emission layer 552 and the cathode 553 will be described in more detail with reference to FIGS. 5C to 5D.

Figure 5C:
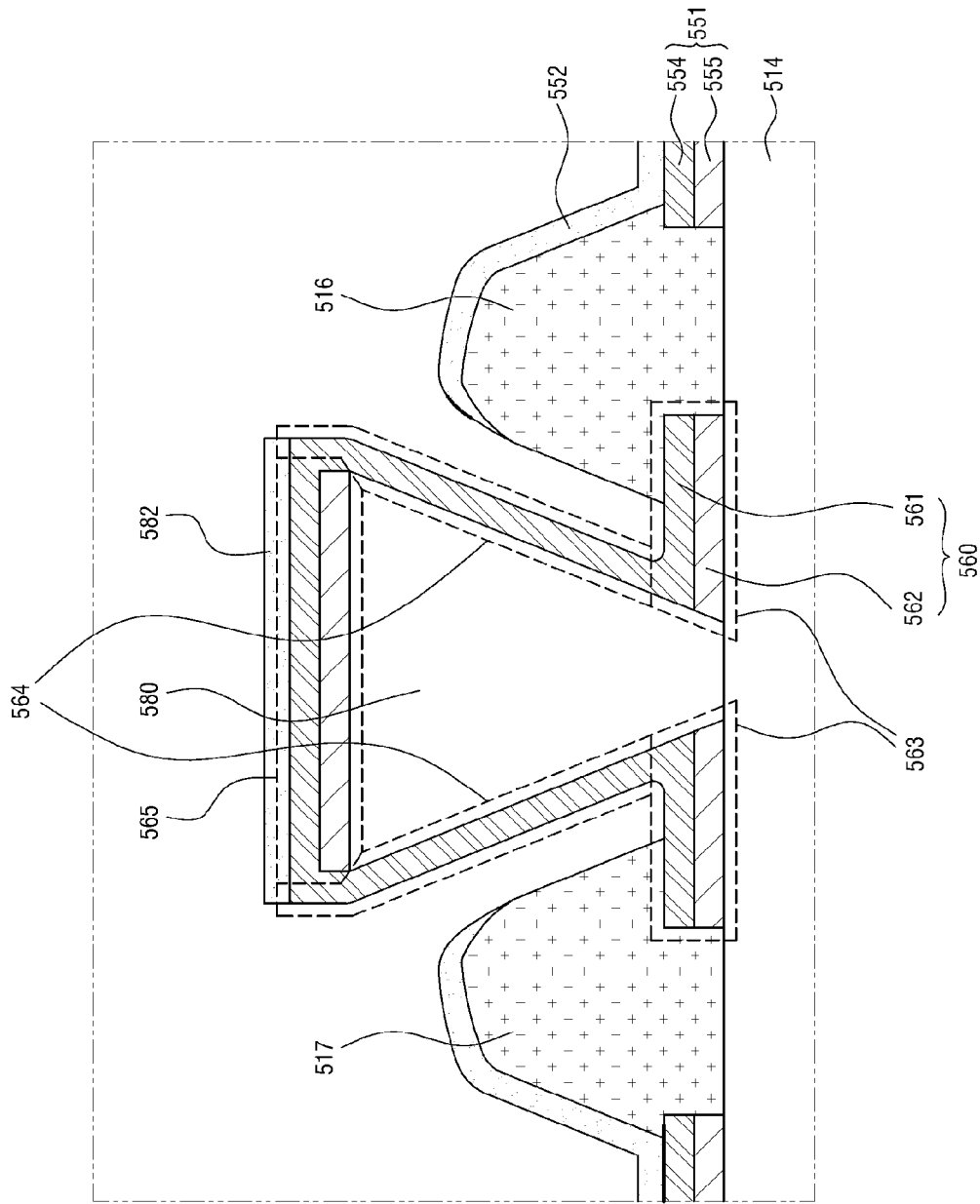

Referring to FIG. 5C, a first bank 516 covering one side of the auxiliary electrode 560 and one side of the anode 551 of the first sub pixel area, and a second bank 517 covering the other side of the auxiliary electrode 560 and one side of the anode 551 of the second sub pixel area are formed. The first bank 516 and the second bank 517 may be made of an organic insulating material, for example, any one of polyimide, photo acryl, and benzocyclobutene (BCB). The first bank 516 and the second bank 517 may have tapered shapes. When the bank 515 has the tapered shape, the first bank 516 and the second bank 517 may be formed by using a positive type photoresist.

The organic emission layer 552 is formed on the anode 551, the bank 515, and the auxiliary electrode 560. The organic emission layer 552 may be one of a red organic emission layer, a green organic emission layer, a blue organic emission layer, and a white organic emission layer. The organic emission layer 552 is formed by a method of depositing a material for the organic emission layer on the entire surface of the planarization layer 514. Since the material used as the organic emission layer 552 has low step coverage, in the case of depositing the material for the organic emission layer, the organic emission layer 552 is formed on the upper side of the anode 551, a partial region of the upper side of the first bank 516, a partial region of the upper side of the second bank 517, and the upper side of the auxiliary electrode 560 formed on the partition 580, but is not formed at the first portion 563 of the auxiliary electrode 560 and the auxiliary electrode 560 formed on the side of the partition 580.

Figure 5D:
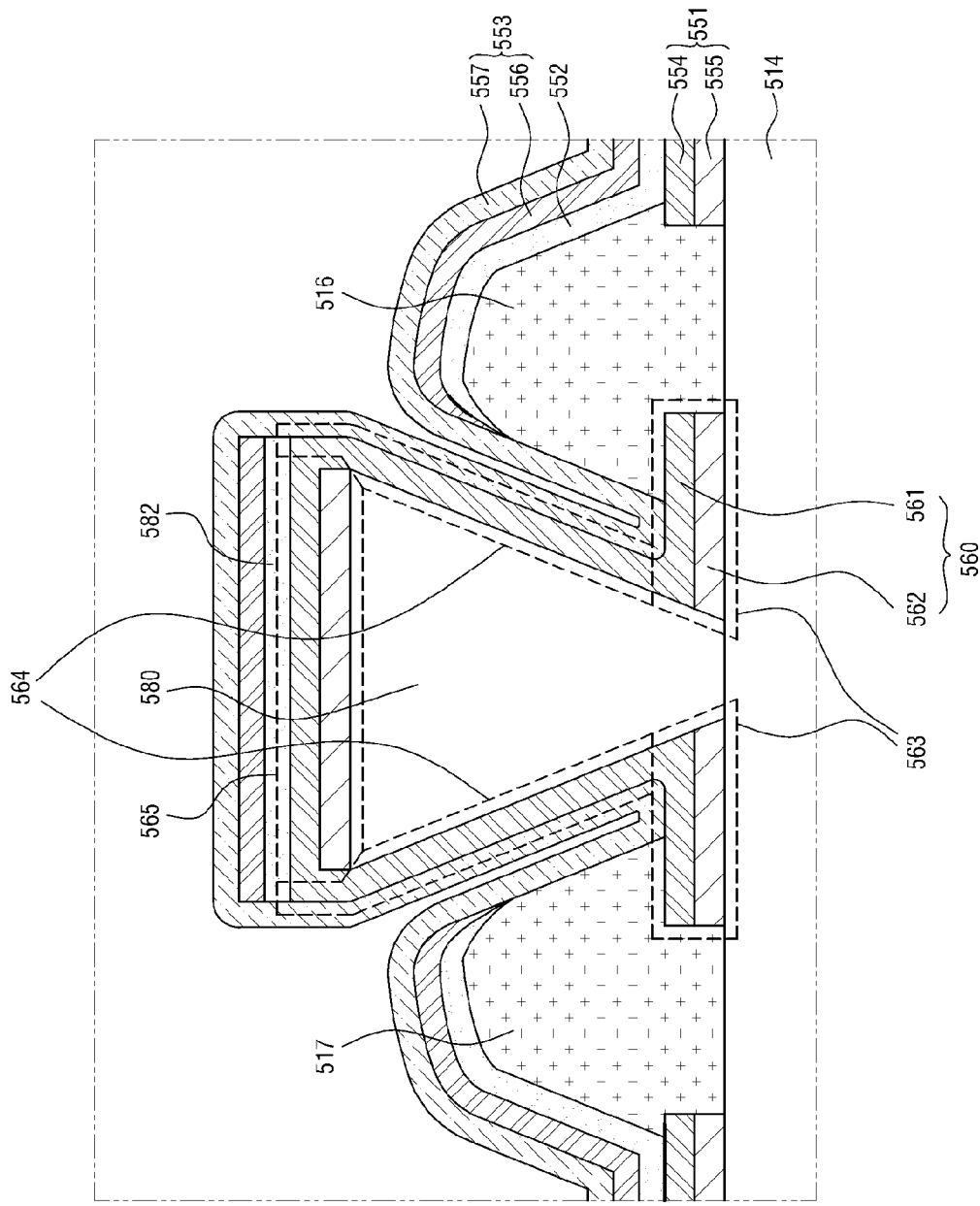

Referring to FIG. 5D, the cathode 553 is formed on the organic emission layer 552. The forming of the cathode 553 includes forming the metal layer 556 by depositing a material for the metal layer 556 over the entire surface of the planarization layer 514. The material used as the metal layer 556 is a metallic material having a low work function, for example, a metallic material such as silver (Ag), titanium (Ti), aluminum (Al), molybdenum (Mo), or an alloy of silver (Ag) and magnesium (Mg), which has low step coverage. Accordingly, when the material for the metal layer 556 is deposited over the entire surface of the planarization layer 514, the metal layer 556 is formed on the upper side of the organic emission layer 552, and is not formed at the first portion 563 of the auxiliary electrode 560 and the auxiliary electrode 560 formed on the side of the partition 580. Since the method for manufacturing the organic light emitting display device according to the exemplary embodiment of the present invention is a method for manufacturing a top-emission type organic light emitting display device, the forming of the metal layer 556 includes forming a substantially transparent metal layer 556 by forming the metallic material having the low work function with a thickness of hundreds Å or less, for example, 200 Å or less.

The forming of the cathode 553 includes forming the transparent conductive layer 557 by depositing a material for the transparent conductive layer over the entire surface of the planarization layer 514. The material used as the transparent conductive layer 557 is a material having high step coverage, and for example, transparent conductive oxide such as indium tin oxide (ITO), indium zinc oxide (IZO), indium tin zinc oxide (ITZO), zinc oxide, and tin oxide may be used. Due to high step coverage of the material for the transparent conductive layer, the transparent conductive layer 557 contacts the second portion 564 of the auxiliary electrode 560 formed at the side of the partition 580 and the first portion 563 of the auxiliary electrode 560 formed on the planarization layer 514. The transparent conductive layer 557 electrically connects the metal layer 556 and the auxiliary electrode 560. The transparent conductive layer 557 may be formed with a thickness of about 100 Å or more in order to provide electric connection between the metal layer 556 and the auxiliary electrode 560.

In the case where the organic emission layer 552 is a white organic emission layer, a color filter may be further formed on the cathode 553 in order to display an image through the organic light emitting display device.

Figure 6:
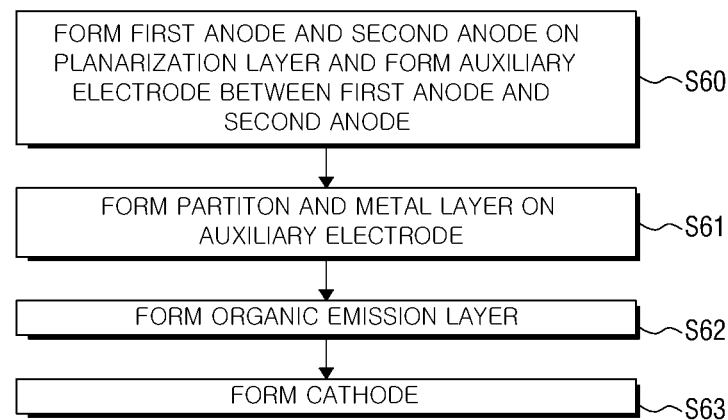
FIG. 6 is a flowchart illustrating a method for manufacturing an organic light emitting display device according to one embodiment of the present disclosure.

FIG. 6 is a flowchart for describing a method for manufacturing an organic light emitting display device for reinforcing a function of an auxiliary electrode according to one exemplary embodiment. FIGS. 7A to 7D are cross-sectional views for each process for describing a method for manufacturing an organic light emitting display device for reinforcing a function of an auxiliary electrode according to one embodiment.

First, a first anode and a second anode are formed on a planarization layer 714, and an auxiliary electrode 760 is formed between the first anode and the second anode (S60). The forming of the anode 751 and the auxiliary electrode 760 will be described in more detail with reference to FIG. 7A.

Figure 7A:
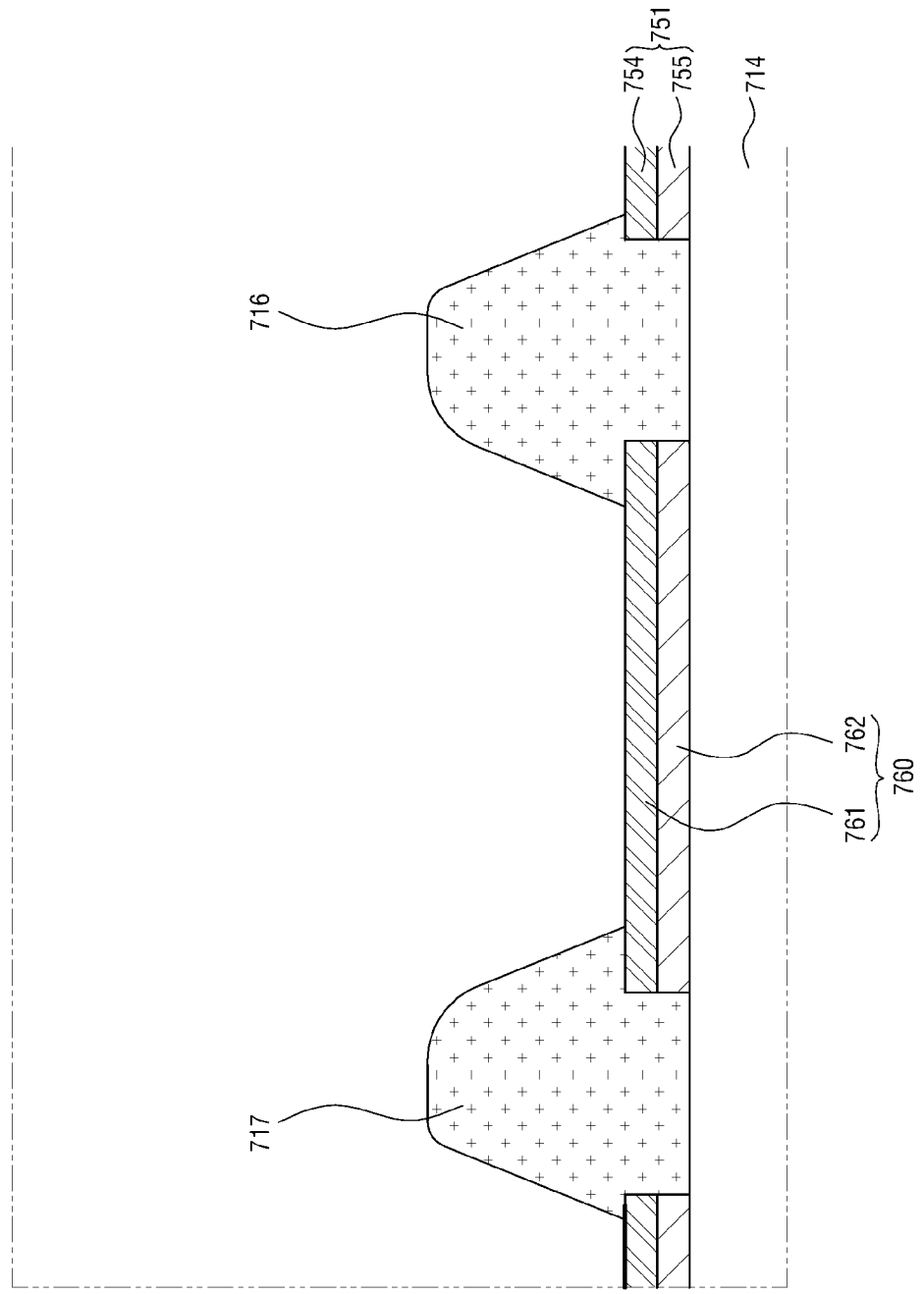
FIGS. 7A to 7D, each illustrates a cross-sectional view of the relevant part of the organic light emitting display device during the manufacturing process described in conjunction with FIG. 6.

Referring to FIG. 7A, the forming of the first anode, the second anode, and the auxiliary electrode 760 may include forming a material for the reflective layer 755, 762 and a material for the transparent conductive layer 754, 761 on the planarization layer 714, and patterning the material for the reflective layer and the material for the transparent conductive layer according to shapes of the first anode, the second anode, and the auxiliary electrode 760. In this specification, the first anode means an anode 751 in the first sub pixel area, and the second anode means an anode 751 in the second sub pixel area.

Next, a first bank 716 covering one side of the anode 751 in the first pixel area and one side of the auxiliary electrode 760, and a second bank 717 covering one side of the anode 751 in the second sub pixel area and the other side of the auxiliary electrode 760 are formed.

Next, a partition 780 and a supplemental conductive layer 790 are formed on the auxiliary electrode 760 (S61), an organic emission layer 752 is formed over the entire surface of the planarization layer 714 (S62), and a cathode 753 is formed over the entire surface of the planarization layer 714 (S63). The forming of the supplemental conductive layer 790, the organic emission layer 752, and the cathode 753 will be described in more detail with reference to FIGS. 7B to 7D.

Figure 7B:
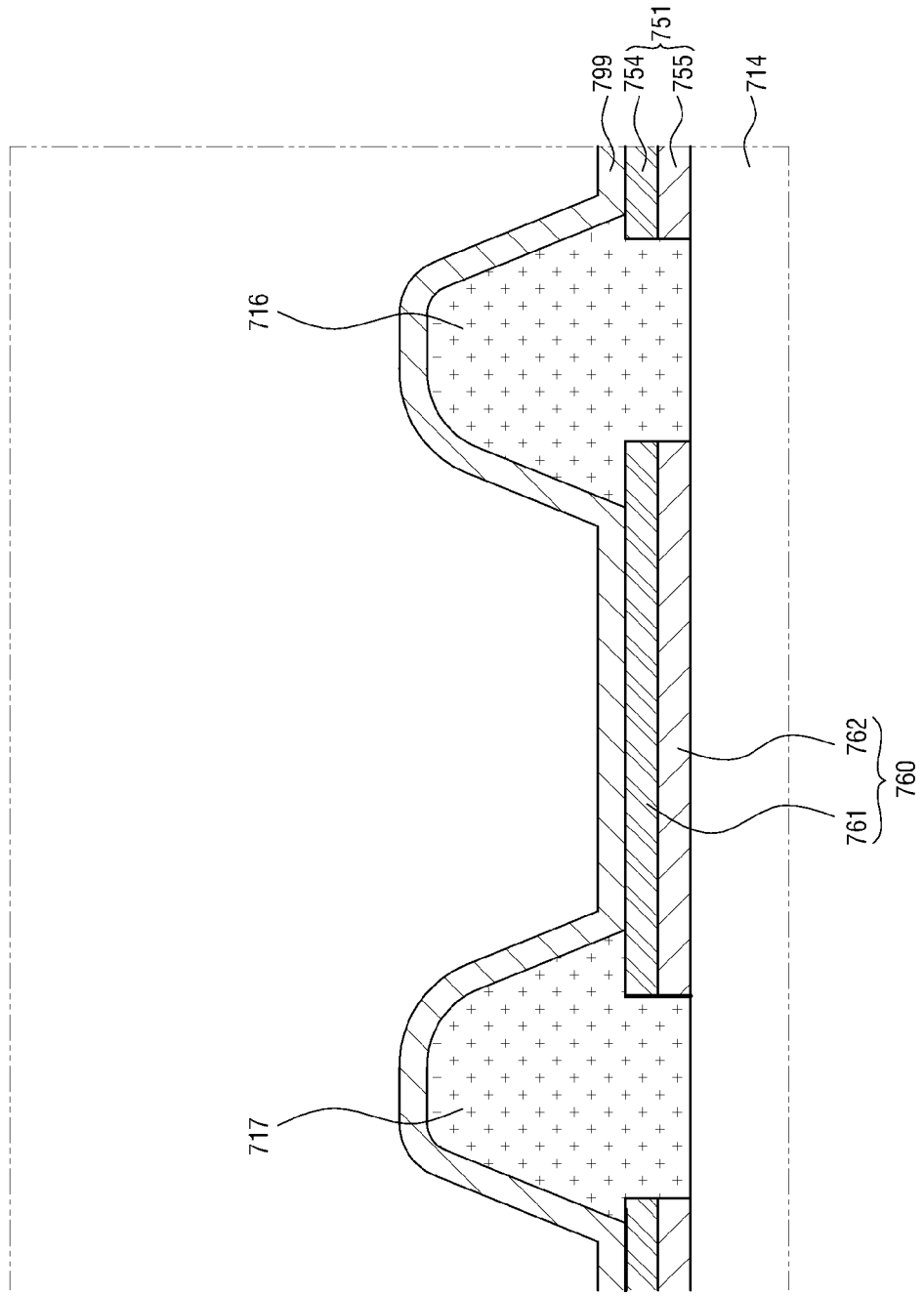
Figure 7C:
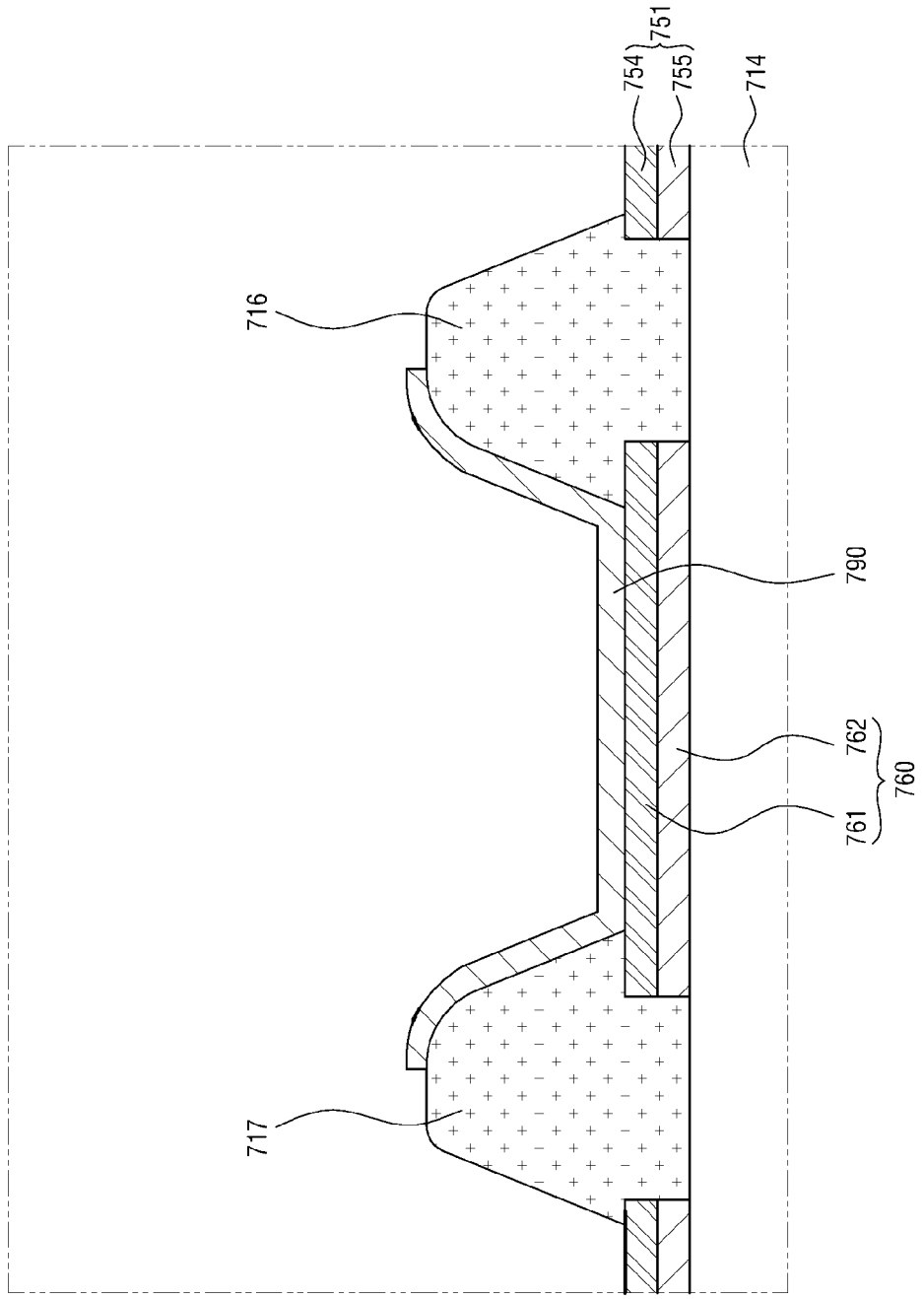
Figure 7D:
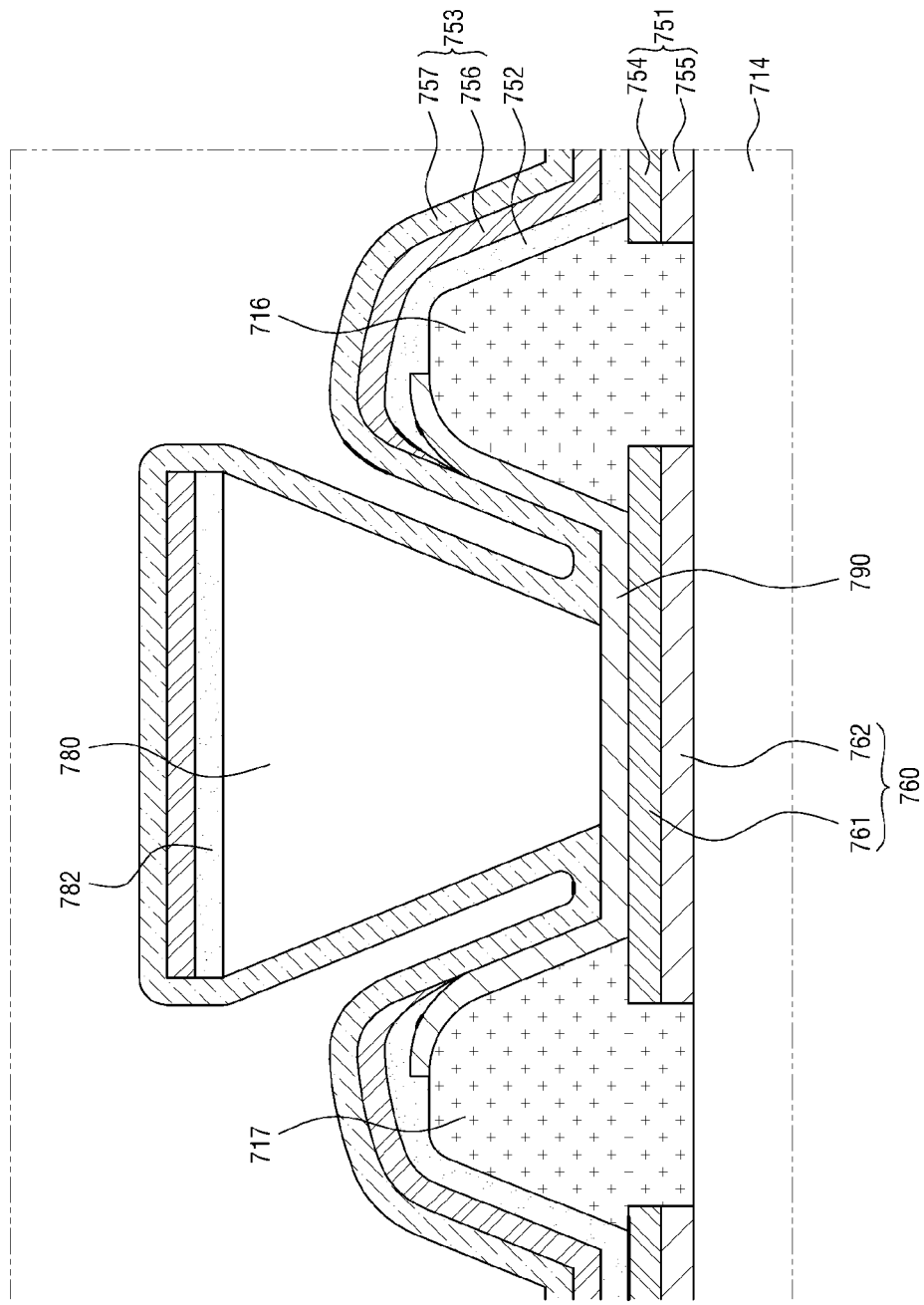

Referring to FIGS. 7B to 7D, a temporary supplemental conductive layer 799 is formed on the anode 751, the auxiliary electrode 760, the first bank 716, and the second bank 717, and the supplemental conductive layer 790 contacting the auxiliary electrode 760 is formed by removing a portion of the temporary supplemental conductive layer 799 except from a region corresponding to the supplemental conductive layer 790. The region corresponding to the supplemental conductive layer 790 is an area overlapping the auxiliary electrode 760 in one embodiment. For example, a photoresist is formed in the region corresponding to the supplemental conductive layer 790 of the temporary supplemental conductive layer 799, and the supplemental conductive layer 790 may be formed by etching the portion of the temporary supplemental conductive layer 799 except form the region corresponding to the supplemental conductive layer 790 by using the photoresist as a mask. Although not illustrated in FIGS. 7B and 7C, the supplemental conductive layer 790 may be formed before forming the first bank 716 and the second bank 717.

Referring to FIG. 7D, the partition 780 is formed on the supplemental conductive layer 790, and the organic emission layer 752 and the cathode 753 are formed over the planarization layer 714 with the partition 780. The forming of the partition 780, the organic emission layer 752, and the cathode 753 is substantially the same as the forming of the partition 780, the organic emission layer 752, and the cathode 753 described in FIGS. 5A to 5D.

Hereinafter, various characteristics of the organic light emitting display device of the present invention will be described.

According to another characteristic of the present invention, the auxiliary electrode disposed over the partition covers side surfaces and a top surface of the partition.

According to still another characteristic of the present invention, the organic light emitting display device further comprises a second conductive element disposed in the first pixel area in contact with the first conductive element and a third conductive element disposed in the second pixel area in contact with the first conductive element.

According to still another characteristic of the present invention, the first conductive element is a transparent conductive layer and the second conductive element and the third conductive element are metal layers disposed underneath the first conductive element.

According to still another characteristic of the present invention, the auxiliary electrode includes a first conductive layer and a second conductive layer, the second conductive layer covering the side surfaces of the partition.

According to still another characteristic of the present invention, an electrical resistance of the first conductive layer is lower than an electrical resistance of the second conductive layer, and wherein a step coverage of the first conductive layer is lower than a step coverage of the second conductive layer.

According to still another characteristic of the present invention, a first anode of the first pixel area and a second anode of the second pixel area each includes a first conductive layer and a second conductive layer, the first conductive layer of the first anode and the second anode made of a same material as the first conductive layer of the auxiliary electrode, and the second conductive layer of the first anode and the second anode made of a same material as the second conductive layer of the auxiliary electrode.

According to still another characteristic of the present invention, the partition includes a first end and a second end opposite the first end, the second end in direct contact with a planarization layer of the organic light emitting display device.

According to still another characteristic of the present invention, the partition and the planarization layer are made of the same material.

According to still another characteristic of the present invention, the first conductive layer includes a first surface and a second surface opposite the first surface, the first surface of the first conductive layer in direct contact with the partition and the second surface of the first conductive layer in direct contact with a planarization layer of the organic light emitting display device.

According to still another characteristic of the present invention, the partition has a reverse-tapered shape having a first end and a second end opposite the first end, the second end narrower than the first end.

Hereinafter, various characteristics of the organic light emitting display device of the present invention will be described.

According to another characteristic of the present invention, the organic light emitting display device further comprises a second conductive element disposed in the first pixel area in contact with the first conductive element and a third conductive element disposed in the second pixel area in contact with the first conductive element.

According to still another characteristic of the present invention, the first conductive element is a transparent conductive layer and the second conductive element and the third conductive element are metal layers disposed underneath the first conductive element.

According to still another characteristic of the present invention, the partition includes a first end and a second end opposite the first end, the second end narrower than the first end.

According to still another characteristic of the present invention, the auxiliary electrode includes a first conductive layer and a second conductive layer, the supplemental conductive layer disposed on the second conductive layer.

According to still another characteristic of the present invention, an electrical resistance of the supplemental conductive layer is lower than an electrical resistance of the second conductive layer of the auxiliary electrode.

According to still another characteristic of the present invention, the supplemental conductive layer is disposed between the partition and the second conductive layer.

According to still another characteristic of the present invention, the supplemental conductive layer is disposed over the partition covering side surfaces of the partition and a top surface of the partition, and the first conductive element is in direct contact with the supplemental conductive layer, the second conductive element disposed in the first pixel area, and the third conductive element disposed in the second pixel area.

According to still another characteristic of the present invention, the organic light emitting display device further comprises a first bank disposed between a first anode of the first pixel area and the auxiliary electrode and a second bank disposed between a second anode of the second pixel area and the auxiliary electrode, wherein the supplemental conductive layer is disposed on at least a portion of the first bank and on at least a portion of the second bank.

Hereinafter, various characteristics of the organic light emitting display device of the present invention will be described.

According to another characteristic of the present invention, the organic light emitting display device further comprises a second conductive element disposed in the first pixel area in contact with the first conductive element, a third conductive element disposed in the second pixel area in contact with the first conductive element, wherein the first conductive element is a transparent conductive layer and the second conductive element and the third conductive elements are metal layers disposed underneath the first conductive element.

According to still another characteristic of the present invention, the conductive partition has a spherical shape or a cylindrical shape.

Hereinafter, various characteristics of the method of manufacturing an organic light emitting display device of the present invention will be described.

According to another characteristic of the present invention, the method further comprises substantially simultaneously forming a second conductive element disposed in the first pixel area in contact with the first conductive element and a third conductive element disposed in the second pixel area in contact with the first conductive element.

According to still another characteristic of the present invention, substantially simultaneously forming over the substrate the first anode of the first organic light emitting element, the second anode of the second organic light emitting element, and the auxiliary electrode comprises forming a first conductive layer over the partition, the first pixel area, and the second pixel area, forming a second conductive layer over the partition, the first pixel area, and the second pixel area, the second conductive layer covering side surfaces and a top surface of the partition and patterning the first conductive layer and the second conductive layer to form the first anode, the second anode, and the auxiliary electrode.

According to still another characteristic of the present invention, substantially simultaneously forming over the substrate the first anode of the first organic light emitting element, the second anode of the second organic light emitting element, and the auxiliary electrode comprises forming a first conductive layer over the substrate, forming the partition on the first conductive layer, forming a second conductive layer over the partition, the first pixel area, and the second pixel area, the second conductive layer covering side surfaces and a top surface of the partition and patterning the first conductive layer and the second conductive layer to form the first anode, the second anode, and the auxiliary electrode.

The exemplary embodiments of the present invention have been described in detail with reference to the accompanying drawings, but the present invention is not limited to the exemplary embodiments. It will be apparent to those skilled in the art that various modifications can be made without departing from the spirit of the invention.

What is claimed is:

1. An organic light emitting display device, comprising:
at least a first pixel area and a second pixel area;
a partition disposed between the first pixel area and the second pixel area;
an auxiliary electrode disposed between the first pixel area and the second pixel area and over the partition; and
a first conductive element disposed over the first pixel area, the second pixel area, and the auxiliary electrode, the first conductive element electrically connected to the auxiliary electrode;
a second conductive element disposed in the first pixel area and in contact with the first conductive element; and
a third conductive element disposed in the second pixel area and in contact with the first conductive element.

2. The organic light emitting display device of claim 1, wherein the auxiliary electrode disposed over the partition covers side surfaces and a top surface of the partition.

3. The organic light emitting display device of claim 1, wherein:
the first conductive element is a transparent conductive layer; and
the second conductive element and the third conductive element are metal layers disposed underneath the first conductive element.

4. The organic light emitting display device of claim 2, wherein the auxiliary electrode includes a first conductive layer and a second conductive layer, the second conductive layer covering the side surfaces of the partition.

5. The organic light emitting display device of claim 4, wherein an electrical resistance of the first conductive layer is lower than an electrical resistance of the second conductive layer, and wherein a step coverage of the first conductive layer is lower than a step coverage of the second conductive layer.

6. The organic light emitting display device of claim 4, wherein a first anode of the first pixel area and a second anode of the second pixel area each includes a first conductive layer and a second conductive layer, the first conductive layer of the first anode and the second anode made of a same material as the first conductive layer of the auxiliary electrode, and the second conductive layer of the first anode and the second anode made of a same material as the second conductive layer of the auxiliary electrode.

7. The organic light emitting display device of claim 1, wherein the partition includes a first end and a second end opposite the first end, the second end in direct contact with a planarization layer of the organic light emitting display device.

8. The organic light emitting display device of claim 7, wherein the partition and the planarization layer are made of the same material.

9. The organic light emitting display device of claim 4, wherein the first conductive layer includes a first surface and a second surface opposite the first surface, the first surface of the first conductive layer in direct contact with the partition and the second surface of the first conductive layer in direct contact with a planarization layer of the organic light emitting display device.

10. The organic light emitting display device of claim 1, wherein the partition has a reverse-tapered shape having a first end and a second end opposite the first end, the second end narrower than the first end.

11. An organic light emitting display device, comprising:
at least a first pixel area and a second pixel area;

an auxiliary electrode disposed between the first pixel area and the second pixel area;

a supplemental conductive layer disposed on the auxiliary electrode;

a partition disposed between the first pixel area and the second pixel area over a part of the auxiliary electrode; and a first conductive element disposed over the first pixel area, the second pixel area, and the supplemental conductive layer, the first conductive element electrically connected to the auxiliary electrode via the supplemental conductive layer.

12. The organic light emitting display device of claim 11, further comprising:

a second conductive element disposed in the first pixel area in contact with the first conductive element; and a third conductive element disposed in the second pixel area in contact with the first conductive element.

13. The organic light emitting display device of claim 12, wherein:

the first conductive element is a transparent conductive layer; and the second conductive element and the third conductive element are metal layers disposed underneath the first conductive element.

14. The organic light emitting display device of claim 11, wherein the partition includes a first end and a second end opposite the first end, the second end narrower than the first end.

15. The organic light emitting display device of claim 11, wherein the auxiliary electrode includes a first conductive layer and a second conductive layer, the supplemental conductive layer disposed on the second conductive layer.

16. The organic light emitting display device of claim 15, wherein an electrical resistance of the supplemental conductive layer is lower than an electrical resistance of the second conductive layer of the auxiliary electrode.

17. The organic light emitting display device of claim 15, wherein the supplemental conductive layer is disposed between the partition and the second conductive layer.

18. The organic light emitting display device of claim 15, wherein the supplemental conductive layer is disposed over the partition covering side surfaces of the partition and a top surface of the partition, and the first conductive element is in direct contact with the supplemental conductive layer, the second conductive element disposed in the first pixel area, and the third conductive element disposed in the second pixel area.

19. The organic light emitting display device of claim 11, further comprising:

a first bank disposed between a first anode of the first pixel area and the auxiliary electrode; and a second bank disposed between a second anode of the second pixel area and the auxiliary electrode;

wherein the supplemental conductive layer is disposed on at least a portion of the first bank and on at least a portion of the second bank.

20. An organic light emitting display device, comprising:

at least a first pixel area and a second pixel area;

an auxiliary electrode disposed between the first pixel area and the second pixel area;

a conductive partition disposed on at least a part of the auxiliary electrode;

a first conductive element disposed over the first pixel area, the second pixel area, and the conductive partition, the first conductive element in direct contact with the conductive partition and electrically connected to the auxiliary electrode via the conductive partition.

21. The organic light emitting display device of claim 20, comprising:

a second conductive element disposed in the first pixel area in contact with the first conductive element;

a third conductive element disposed in the second pixel area in contact with the first conductive element;

wherein the first conductive element is a transparent conductive layer and the second conductive element and the third conductive elements are metal layers disposed underneath the first conductive element.

22. The organic light emitting display device of claim 20, wherein the conductive partition has a spherical shape or a cylindrical shape.

23. A method of manufacturing an organic light emitting display device comprising a plurality of pixel areas including at least a first pixel area and a second pixel area adjacent to the first pixel area, the first pixel area including a first organic light emitting element, and the second pixel area including a second organic light emitting element, the method comprising:

forming a partition over a substrate;

substantially simultaneously forming over the substrate a first anode of the first organic light emitting element, a second anode of the second organic light emitting element, and an auxiliary electrode between the first pixel area and the second pixel area and over the partition;

forming an organic emission layer over the first anode and over the second anode;

forming a first conductive element over the organic emission layer and the auxiliary electrode, the first conductive element electrically connected to the auxiliary electrode; and substantially simultaneously forming a second conductive element disposed in the first pixel area in contact with the first conductive element and a third conductive element disposed in the second pixel area in contact with the first conductive element.

24. The method of claim 23, wherein substantially simultaneously forming over the substrate the first anode of the first organic light emitting element, the second anode of the second organic light emitting element, and the auxiliary electrode comprises:

forming a first conductive layer over the partition, the first pixel area, and the second pixel area;

forming a second conductive layer over the partition, the first pixel area, and the second pixel area, the second conductive layer covering side surfaces and a top surface of the partition; and patterning the first conductive layer and the second conductive layer to form the first anode, the second anode, and the auxiliary electrode.

25. The method of claim 23, wherein substantially simultaneously forming over the substrate the first anode of the first organic light emitting element, the second anode of the second organic light emitting element, and the auxiliary electrode comprises:

forming a first conductive layer over the substrate;

forming the partition on the first conductive layer;

forming a second conductive layer over the partition, the first pixel area, and the second pixel area, the second conductive layer covering side surfaces and a top surface of the partition; and patterning the first conductive layer and the second conductive layer to form the first anode, the second anode, and the auxiliary electrode.

26. A method of manufacturing an organic light emitting display device comprising a plurality of pixel areas including at least a first pixel area and a second pixel area adjacent to the first pixel, the first pixel area including a first organic light emitting element, and the second pixel area including a second organic light emitting element, the method comprising:
- substantially simultaneously forming over a substrate a first anode of the first organic light emitting element, a second anode of the second organic light emitting element, and an auxiliary electrode between the first pixel area and the second pixel area;
- forming a supplemental conductive layer and a partition over the auxiliary electrode, a portion of the supplemental conductive element in direct contact with the auxiliary electrode;
- forming an organic emission layer over the first anode and over the second anode; and
- forming a first conductive element over the organic emission layer and the supplemental conductive layer, the first conductive element electrically connected to the auxiliary electrode via the supplemental conductive layer.

* * * * *